(12) United States Patent
Shimizu et al.

(10) Patent No.: US 7,715,808 B2
(45) Date of Patent: May 11, 2010

(54) POLAR MODULATING CIRCUIT, POLAR COORDINATE MODULATING METHOD, INTEGRATED CIRCUIT AND RADIO TRANSMISSION DEVICE

(75) Inventors: Yoshito Shimizu, Kanagawa (JP); Noriaki Saito, Tokyo (JP)

(73) Assignee: Panasonic Corporation, Osaka (JP)

( * ) Notice: Subject to any disclaimer, the term of this patent is extended or adjusted under 35 U.S.C. 154(b) by 497 days.

(21) Appl. No.: 11/814,181

(22) PCT Filed: Apr. 26, 2006

(86) PCT No.: PCT/JP2006/308739

§ 371 (c)(1),
(2), (4) Date: Jul. 18, 2007

(87) PCT Pub. No.: WO2006/118147

PCT Pub. Date: Nov. 9, 2006

(65) Prior Publication Data

US 2008/0026706 A1    Jan. 31, 2008

(30) Foreign Application Priority Data

Apr. 28, 2005  (JP) .............................. 2005-131998
Apr. 19, 2006  (JP) .............................. 2006-116185

(51) Int. Cl.
*H04B 1/02*    (2006.01)
(52) U.S. Cl. ...................... 455/108; 455/126; 455/205; 375/300; 332/145
(58) Field of Classification Search ................. 455/102, 455/108, 110, 126, 205, 333; 375/297, 300; 332/145, 155
See application file for complete search history.

(56) References Cited

U.S. PATENT DOCUMENTS

| 6,834,084 | B2 * | 12/2004 | Hietala ........................ 375/296 |
| 7,109,816 | B2 * | 9/2006 | Khlat .......................... 332/112 |
| 7,274,748 | B1 * | 9/2007 | Khlat .......................... 375/296 |

(Continued)

FOREIGN PATENT DOCUMENTS

EP    1 557 955 A1    7/2005

(Continued)

OTHER PUBLICATIONS

"High Linearity RF Amplifier Design", Sep. 17, 2002.

(Continued)

*Primary Examiner*—Nhan Le
(74) *Attorney, Agent, or Firm*—Pearne & Gordon LLP

(57) ABSTRACT

This invention intends to provide a polar modulating circuit, a polar modulating method, an integrated circuit and a radio transmission device capable of compensating for a delay difference between paths of a phase signal and an amplitude signal while suppressing an increase in the circuit scale in a polar modulating system. In a delay quantity determining unit 102, delay quantity information relative to the amplitude value of the amplitude signal or transmission level information S1, based on the step response characteristic of a power amplifying unit 105 are previously stored as table data. Thus, by executing delay adjustment using, as a reference signal, the amplitude signal or transmission level information S1, the delay difference between paths of a phase signal and an amplitude signal can be compensated for while suppressing an increase in the circuit scale.

17 Claims, 13 Drawing Sheets

U.S. PATENT DOCUMENTS

| | | | |
|---|---|---|---|
| 7,358,829 B2 * | 4/2008 | Oka | 332/145 |
| 7,359,680 B2 * | 4/2008 | Klemmer | 455/102 |
| 7,535,310 B2 * | 5/2009 | Shimizu et al. | 332/103 |

FOREIGN PATENT DOCUMENTS

| | | |
|---|---|---|
| JP | 06-054877 | 7/1994 |
| JP | 2005-530992 | 9/2002 |
| JP | 2004-501527 | 1/2004 |
| JP | 2004-173249 | 6/2004 |
| JP | 2005-020696 | 1/2005 |
| WO | 01/58012 | 8/2001 |

OTHER PUBLICATIONS

Chinese Office Action dated Jul. 3, 2009.

\* cited by examiner

POLAR MODULATING CIRCUIT, POLAR COORDINATE MODULATING METHOD, INTEGRATED CIRCUIT AND RADIO TRANSMISSION DEVICE

TECHNICAL FIELD

This invention relates to a polar modulating circuit, a polar modulating method, an integrated circuit and a radio transmission device for assuring synchronization in composing a phase-modulated signal and an amplitude-modulated signal in a polar modulating system capable of realizing a transmitter with high efficiency.

BACKGROUND ART

In the cellular phone service in recent years, since a demand for data communication as well as voice communication has been expanded, improvement of a communication speed is important. For example, in the GSM (Global System for Mobile communications) which has become widespread in mainly European and Asian regions, conventionally, voice communication has been executed in GMSK modulation which shifts the phase of a carrier wave according to transmitted data. Further, an EDGE (Enhanced Data rates for GSM Evolution) system has been proposed in which data communication is made by $3\pi/8$ rotating 8-PSK modulation (hereinafter abbreviated as 8-PSK modulation) in which bit information for one symbol is enhanced three-times as large as in the GMSK modulation by shifting the phase and amplitude of the carrier wave according to the transmitted data.

In the linear modulating system which gives amplitude changes like the 8-PSK modulation, the requirement of linearity for a power amplifying unit of a radio transmitter is strict. In addition, the power efficiency in a linear operating point of the power amplifying unit is lower than that in a saturated operating point. Therefore, if a convention orthogonal modulating system is applied to a linear modulating system, it was difficult to realize the high efficiency in the power efficiency.

In order to obviate such an inconvenience, there is a previously known system in which a transmitted signal is separated into a constant-amplitude phase signal and an amplitude signal, and a signal is phase-modulated on the basis of the constant-amplitude phase signal by a phase modulator and the constant-amplitude phase-modulated signal having a level at which a power amplifying unit operates in saturation is input to the power amplifying unit and a control voltage of the power amplifying unit is driven at a high speed and the phase modulation is combined with the amplitude modulation. This system is called an EER method (Envelope Elimination & Restoration) or polar modulation system (polar modulation, polar modulating system) which can realize the high efficiency of the power amplifying unit through the linear modulating system) (for example, see Non-Patent Reference 1). In order to clarify that this system is a modulating system different from the orthogonal modulating system, it is called the polar modulating system.

FIG. 11 is a graph in which the amplitude signal in 8-PSK modulation in the range of 200 to 400 [µs] extracted from one time slot (577 [µs]) of GSM is plotted. In FIG. 11, the abscissa represents a passage time from start of the time slot; and the ordinate represents an amplitude of the amplitude signal. In the polar modulating system, the constant-amplitude phase modulated signal is supplied to the power amplifying unit so that the power amplifying unit can be used at the saturation operating point. This is advantageous in the power efficiency.

However, in order to express the amplitude signal in which there is a flexing point between a maximum value and a minimum value within 2 [µs] as in FIG. 11, the control voltage for the power amplifying unit must be driven at a high speed. So, the output response in the power amplifying unit to changes in the input control voltage requires an improving technique (distortion compensating technique).

Further, the polar modulating system is a system in which the transmitted signal is once separated into the amplitude signal and the phase signal and thereafter composed again. Therefore, if synchronization is lost between the amplitude signal and the phase signal until they are recomposed after separated, the transmitted signal cannot be expressed exactly at the time of recomposing. Accordingly, a synchronizing technique for acquiring the synchronization between the amplitude signal and the phase signal is required.

An explanation will be given of prior arts of two techniques required by the polar modulating system hitherto explained.

First, there is a prior art on the distortion compensation and synchronization in the polar modulating system in which in the power amplifying unit in a saturating operation type at a predetermined input high frequency amplitude, the output signal amplitude characteristic (AM-AM: Amplitude Modulation to Amplitude Modulation conversion) and passing phase characteristic (AM-PM: Amplitude Modulation to Phase Modulation conversion) for the control voltage are stored in a memory. In this prior art, the distortion compensation in a pre-distortion system is executed referring to the memory. In addition, after the transmitted signal has been separated into the amplitude signal and the phase signal, a delay adjusting unit is arranged in a path of the amplitude signal or the phase signal to assure the synchronization between both signals (see, for example, Patent Reference 1).

FIG. 12 is a block diagram of a prior art transmission device described in Patent Reference 1. As seen from FIG. 12, this transmission device includes a power amplifying unit (PA) 900, a polar coordinate converting unit 901, a delay adjusting unit 902, a memory 903, an amplitude controller unit 906 having an amplitude information correcting unit 904 and an amplitude modulating unit 905, and a phase modulating signal generator 909 having a phase information correcting unit 907 and a phase modulating unit 908.

The polar coordinate converting unit 901 separates I/Q signals (I, Q) supplied from a baseband signal generating unit not shown into an amplitude signal r and a phase signal θ with a constant amplitude. The delay adjusting unit 902 gives prescribed delays to the input amplitude signal r and phase signal θ, respectively, thereby assuring synchronization between the amplitude signal r2 and phase signal θ2 which are to be outputted. With a predetermined input high frequency signal amplitude being applied to the power amplifying unit 900, the memory 903 stores the AM-AM characteristic and AM-PM characteristic for a control signal to be inputted to the power amplifying unit 900. According to the input amplitude signal r2, the memory 903 also produces an amplitude correction signal and a phase correction signal which provide characteristics reverse to the power amplifying unit 900.

The amplitude information correcting unit 904 makes a correction to the input amplitude signal on the basis of the amplitude correction signal supplied from the memory 903. The amplitude modulating unit 905 drives the control voltage for the power amplifying unit 900 at a high speed on the basis of the output signal from the amplitude information correcting unit 904. The phase information correcting unit 907 makes a correction for the input phase signal on the basis of the phase correction signal supplied from the memory 903.

The phase modulating unit 908 makes a phase modulation on the basis of the output signal from the phase information correcting unit 907.

In this way, the amplitude modulated signal and phase modulated signal previously distorted considering the reverse characteristic of the output characteristic for the input control signal to the power amplifying unit 900 are affected by actual distortion in the amplitude and phase generated in the power amplifying unit 900 to provide a desired output amplitude and phase. Thus, the output response (linearity) for the input control voltage can be improved. Further, since synchronization between the amplitude signal and the phase signal can be assured by the delay adjusting unit 902, the transmitted signal can be expressed exactly.

Patent Reference 1, however, does not disclose concrete techniques of distortion compensation and synchronization. Therefore, the technique disclosed in Patent Reference 1 cannot deal with the case where the synchronization between the amplitude signal and the phase signal is lost by any cause.

FIG. 13 is a plotted graph of passing phase characteristics when the control voltage gradually changing (monotonous increase or monotonous decrease) for time passage is applied to the power amplifying unit. In FIG. 13, the abscissa represents a normalized control voltage and the ordinate represents a passing phase rotation with reference to the normalized control voltage of 1. In this figure, the solid line represents the passing phase characteristic when the normalized control voltage is gradually changed from a low voltage (0) to a high voltage (1) in the monotonous increase (ascent-characteristic). Further, the dotted line represents the passing phase characteristic when the normalized control voltage is gradually changed from the high voltage (1) to the low voltage (0) in the monotonous decrease (descent-characteristic). Incidentally, both slid line and dotted line represent the cases where the power amplifying unit is supplied with the input high frequency signal amplitude (same value) in the predetermined level of its saturating operation.

In the polar modulating system, since the control voltage for the power amplifying unit is driven at a high speed, a difference occurs between the charging time and the discharging time of the capacitor (inclusive of a parasitic capacitor) in the unit for supplying the control voltage to the power amplifying unit. Therefore, as shown in FIG. 13, even with the change widths being equal, the quantity of phase change differs between the case where the condition of applying the control voltage changes from the low voltage to the high voltage and the case where it changes from the high voltage to the low voltage. Namely, the phase characteristic changes at a signal changing point. This means that synchronization between the amplitude signal and the phase signal is lost.

Next, an explanation will be given of a prior art of synchronization at the signal changing point in the polar modulating system. As such a prior art, there is a technique of detecting the output signal amplitude in the power amplifying unit and differentiating the detected signal thereby acquiring the signal changing point. In this prior art, after the signal changing point has been acquired, a delay from a reference clock to be supplied to a digital-analog conversion circuit (hereinafter referred to as a DA converter) for converting the amplitude signal and the phase signal from a digital format into an analog format is adjusted. Further, the synchronizing timing at the signal changing point is adjusted (for example, see Patent Reference 2).

FIG. 14 is a block diagram of a prior art transmission device disclosed in Patent Reference 2. As seen from FIG. 14, this transmission device includes a power amplifying unit 900, an amplitude modulating unit 905, a phase modulating unit 908, DA converters 1101, 1102 and a reference clock 1103, a changing point detecting circuit 1104 and a delaying unit 1105.

The DA converter 1101 converts I/Q signals (I,Q) in the digital format supplied from a baseband signal generating unit (not shown) into the I/Q signals in the analog format. The DA converter 1102 converts an amplitude signal (r) extracted from the I/Q signals (I, Q) in the digital signal by a polar coordinate converting unit (not shown) into the amplitude signal in the analog format. The reference clock 1103 supplies a clock which is a reference to the converting operation to the DA converters 1101, 1102.

The amplitude modulating unit 905 drives a power supply voltage to the power amplifying unit 900 at a high speed. The phase modulating unit 908 generates a phase modulated signal on the basis of the I/Q signals in the analog format, which is sent to the power amplifying unit 900. The changing point detecting circuit 1104 differentiates the output signal from the power amplifying unit 900 and thereafter detects the signal changing point according to whether the differentiated value is positive or negative. At the signal changing point detected by the changing point detecting circuit 1104, the delaying unit 1105 adjusts the converting timings in the DA converters 1101 and 1102, i.e. the synchronization between the amplitude signal and phase signal extracted from the I/Q signals. In this configuration, the signal changing point can be detected and the synchronization between the amplitude signal and the phase signal can be assured at the signal changing point detected.

Patent Reference 1: JP (Tokuhyou) 2004-501527 (FIG. 11)

Patent Reference 2: JP (Tokuhyou) 2002-530992 (FIG. 2)

Non-Patent Reference 1: Kenington, Peter B, "High-Linearity RF Amplifier Design", Artech House Publishers (p 162, FIGS. 4, 18)

DISCLOSURE OF THE INVENTION

Problems that the Invention is to Solve

In the polar modulating system, in order to express the transmitted signal exactly, a synchronizing technique for assuring the amplitude signal and the phase signal is required. An explanation will be given of the problems not stilled solved by the prior art for the technique required to realize the polar modulating system as described above.

The synchronizing technique in the polar modulating system proposed in Patent Reference 1, which does not disclose the concrete method for assuring synchronization, cannot deal with the case where the synchronization between the amplitude signal and the phase signal is lost by any cause.

In the synchronizing technique at a signal changing point in the polar modulating system disclosed in Patent Reference 2, a system for branching and feeding back the output signal from the power amplifying unit 900 is required. This increases the circuit scale and increases the loss at the output portion in the power amplifying unit 900 so that the efficiency of the transmission device will be deteriorated. Further, this synchronizing technique cannot deal with the case where synchronization is lost owing to the other cause than the signal changing point.

This invention has been accomplished in view of the above conventional circumstances. An object of this invention is to provide a polar modulating circuit, a polar modulating method, an integrated circuit and a radio transmission device capable of assuring synchronization in composing a phase-modulated signal and an amplitude-modulated signal while suppressing an increase in the circuit scale in a polar modulating system.

Means for Solving the Problems

The polar modulating circuit according to this invention is, firstly, a polar modulating circuit comprising: a polar coordinate converting unit for generating an amplitude signal orthogonal baseband orthogonal signals generated from transmitted data; an amplitude modulating unit for generating an amplitude-modulated signal on the basis of the amplitude signal; a phase modulating unit for generating a phase-modulated signal in a radio frequency band on the basis of a signal having at least a phase component of the baseband orthogonal signals; an amplifying unit for generating transmitted data in the radio frequency band by receiving the phase-modulated signal as an input high frequency signal and amplitude-modulated signal as a control signal; a delay quantity determining unit for storing delay quantity information for correcting a delay difference between paths of the amplitude signal and the phase signal according to an amplitude value of the amplitude signal or transmission level information indicative of a radio transmission level of the transmitted data; and a delay adjusting unit for giving a delay to the amplitude signal or the signal having at least the phase component on the basis of the delay quantity information.

In accordance with this configuration, a delay difference between the paths of the phase signal and the amplitude signal can be compensated for in a simple configuration without using the system for branching and feeding back the output signal from the amplifying unit.

The polar modulating circuit according to this invention is, secondly, the first polar modulating circuit further comprising a memory unit for storing pre-distortion distortion correction data for predetermined amplitude correction and producing, on the basis of the amplitude signal, an amplitude correction signal and a phase correction signal for the amplitude signal or the signal having at least the phase component, respectively.

In accordance with this configuration, in addition to the effect by the first polar modulating circuit, the precision of distortion compensation can be improved.

The polar modulating circuit according to this invention is, thirdly, the first or second polar modulating circuit, wherein the delay quantity information is a value determined on the basis of a step response characteristic of an output from the amplifying unit for the control signal supplied to the amplifying unit.

In accordance with this configuration, in addition to the effect by the first or second polar modulating circuit, determination of the delay adjustment quantity can be facilitated.

The polar modulating circuit according to this invention is, fourthly, the first or second polar modulating circuit, wherein the delay quantity determining unit has a data table for storing the delay quantity information relative to the amplitude value of the amplitude signal or the transmission level information.

In accordance with this configuration, synchronization in composing the phase-modulated signal and amplitude-modulated signal can be assured while suppressing an increase in the circuit scale.

The polar modulating circuit according to this invention is, fifthly, the first or second polar modulating circuit, wherein the phase modulating unit includes: an orthogonal coordinate converting unit for generating orthogonal signals having prescribed amplitude values on the basis of the phase information supplied from the delay adjusting unit and an orthogonal modulating unit for generating the phase-modulated signal in the radio frequency band on the basis of the orthogonal signals and supplying it to the amplifying unit.

In accordance with this configuration, the circuit scale for assuring the synchronization in composing the phase-modulated signal and the amplitude-modulated signal can be reduced.

The polar modulating circuit according to this invention is, sixthly, any one of the first to third polar modulating circuits, wherein the delay adjusting unit includes: a first delay adjusting unit for executing delay adjustment in units of a predetermined operating clock for a digital signal processing unit constituting the polar modulating circuit; and a second delay adjusting unit for executing delay adjustment shorter than the units of the clock.

In accordance with this configuration, the accuracy of delay adjustment step can be improved without being subjected to the limitation of a predetermined operating clock in a digital signal processing unit.

The polar modulating circuit according to this invention is, seventhly, the sixth polar modulating circuit wherein the second delay adjusting unit executes linear interpolation based on a plurality of signal amplitude values after delay-adjusted in units of the predetermined operating clock and the delay quantity information.

In accordance with this configuration, the accuracy of a delay adjusting step can be improved in a simple configuration.

The polar modulating circuit according to this invention is, eighthly, a polar modulating circuit comprising: a polar coordinate converting unit for generating an amplitude signal on the basis of baseband orthogonal signals generated from transmitted data; an amplitude modulating unit for generating an amplitude-modulated signal on the basis of the amplitude signal; a phase modulating unit for generating a phase-modulated signal in a radio frequency band on the basis of a signal having at least a phase component of the baseband orthogonal signals; an amplifying unit for generating transmitted data in the radio frequency band by receiving the phase-modulated signal as an input high frequency signal and amplitude-modulated signal as a control signal; a delay quantity determining unit for storing phase adjustment quantity information for correcting a phase difference between the amplitude signal and the phase signal according to an amplitude value of the amplitude signal or transmission level information indicative of a radio transmission level of the transmitted data; and a phase adjusting unit for adjusting the phase of the amplitude signal or the signal having at least the phase component on the basis of the phase adjustment quantity information.

In accordance with this configuration, the circuit scale for assuring synchronization in composing a phase-modulated signal and an amplitude-modulated signal can be improved.

The polar modulating circuit according to this invention is, ninthly, the eighth polar modulating circuit, further comprising a memory unit for storing pre-distortion distortion correction data for predetermined amplitude correction and producing, on the basis of the amplitude signal, an amplitude correction signal and a phase correction signal for the amplitude signal or the signal having at least the phase component, respectively.

In accordance with this configuration, the synchronization in composing a phase-modulated signal and an amplitude-modulated signal can be assured and the accuracy of distortion compensation can be improved.

The polar modulating circuit according to this invention is, tenthly, the ninth polar modulating circuit, wherein the phase adjusting unit is constructed of a multiplying circuit for multiplying the phase adjustment quantity information and the phase correction signal.

In accordance with this configuration, the circuit scale for assuring synchronization in composing a phase-modulated signal and an amplitude-modulated signal can be improved.

The polar modulating circuit according to this invention is, eleventhly, the ninth polar modulating circuit, wherein the phase adjustment quantity determining unit has a data table for storing the phase adjustment quantity information relative to the amplitude value of the amplitude signal or the transmission level information.

In accordance with this configuration, synchronization in composing the phase-modulated signal and amplitude-modulated signal can be assured while suppressing an increase in the circuit scale.

The polar modulating circuit according to this invention is, twelfthly, a polar modulating method comprising: a polar coordinate converting step for generating an amplitude signal on the basis of baseband orthogonal signals generated from transmitted data; an amplitude modulating step for generating an amplitude-modulated signal on the basis of the amplitude signal; a phase modulating step for generating a phase-modulated signal in a radio frequency band on the basis of a signal having at least a phase component of the baseband orthogonal signals; an amplifying step for generating transmitted data in the radio frequency band by receiving the phase-modulated signal as an input high frequency signal and amplitude-modulated signal as a control signal; a delay quantity determining step for storing delay quantity information for correcting a delay difference between paths of the amplitude signal and the phase signal according to an amplitude value of the amplitude signal or transmission level information indicative of a radio transmission level of the transmitted data; and a delay adjusting step for giving a delay to the amplitude signal or the signal having at least the phase component on the basis of the delay quantity information.

In accordance with this method, a delay difference between the paths of the phase signal and the amplitude signal can be simply compensated for without using a step of branching and feeding back the output signal after the amplifying step.

The integrated circuit according to this invention is, thirteenthly, an integrated circuit in which any one of the first to eleventh polar modulating circuits is mounted.

In accordance with this invention, in addition to the effect by any one of the first to eleventh polar modulating circuits, the circuit scale can be reduced.

The radio transmission device according to this invention is, fourteenthly, a radio transmission device including any one of the first to eleventh polar modulating circuit or the thirteenth integrated circuit.

In accordance with this configuration, the radio transmission device with high efficiency can be realized.

Advantage of the Invention

In accordance with this invention, there are provided a polar modulating circuit, a polar modulating method, an integrated circuit and a radio transmission device capable of compensating for a delay difference between the paths of a phase signal and an amplitude signal while suppressing an increase in the circuit scale in a polar modulating system.

DESCRIPTION OF REFERENCE NUMERALS AND SIGNS

Figure 1:
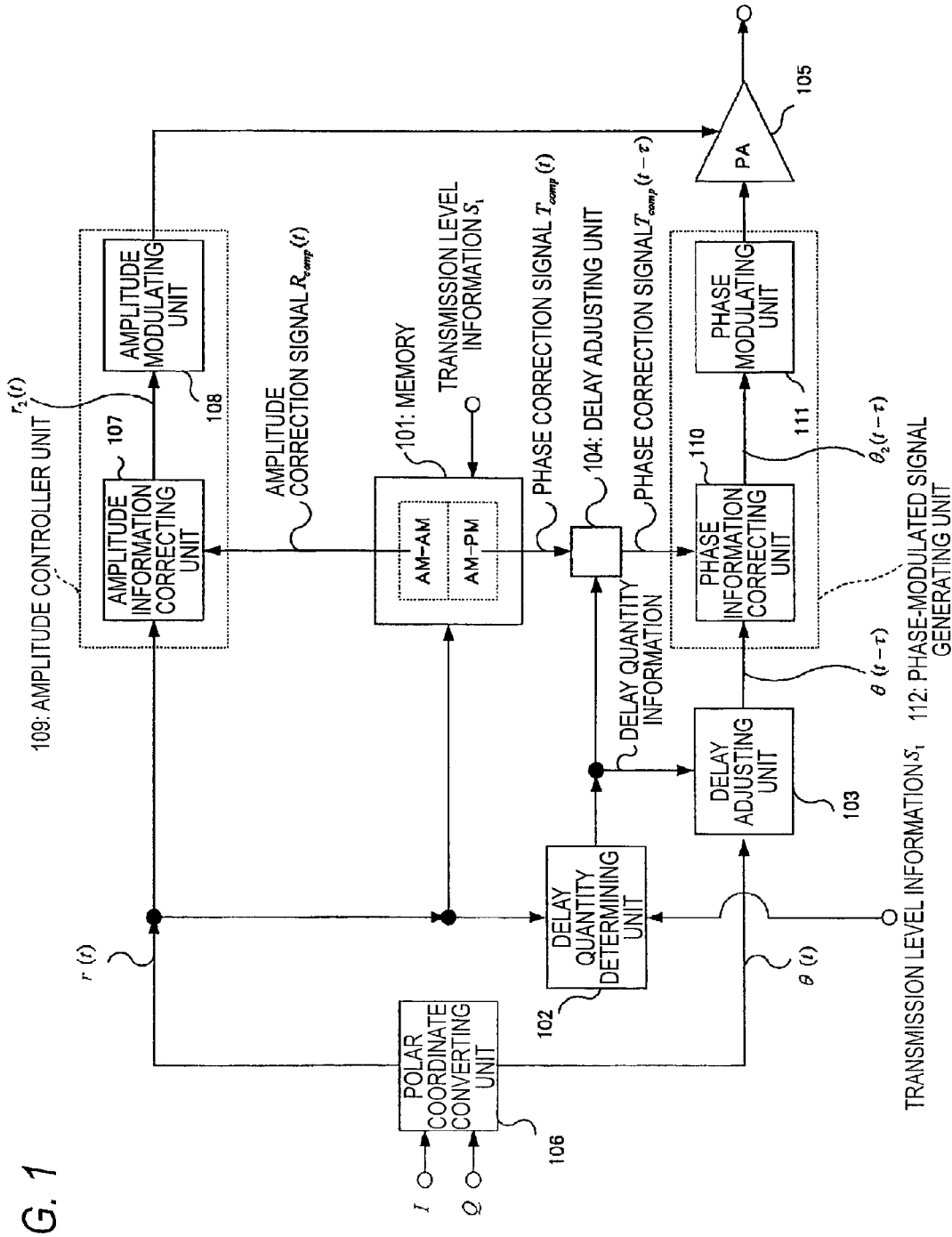
FIG. 1 is a view showing an arrangement of the polar modulating circuit according to a first embodiment of this invention.

101, 302, 903 memory
102 delay quantity determining unit
103, 103B, 104, 301, 902 delay adjusting unit
103C first delay adjusting unit
103D second delay adjusting unit
105, 900 power amplifying unit
106, 901 polar coordinate converting unit
107, 904 amplitude information correcting unit
108, 905 amplitude modulating unit
109, 906 amplitude controller unit
110, 907 phase information correcting unit
111, 908 phase modulating unit
112, 112B, 112C, 909 phase-modulated signal generating unit
111C orthogonal modulating unit
113 orthogonal coordinate converting unit
201 AM-AM characteristic
202, 701, 702 AM-PM characteristic
203 amplitude signal
204 amplitude signal after corrected
205 phase corrected signal
401 transistor
402 base terminal
403 emitter terminal
404 collector terminal
405 base-collector capacitor
501, 502 step response characteristic in a power amplifying
503 delay quantity 601 phase adjustment quantity determining unit
602 phase adjusting unit
1101, 1102 DA converter
1103 reference clock
1104 changing point
1105 delaying unit Embodiment 1

The first embodiment of this invention explains a method for estimating a delay generating cause by analyzing the operation of a power amplifying unit in a polar modulating circuit, making synchronization in a pre-distortion system by specifying the delay generating case and assuring the synchronization without using a feed-back system for branching an output signal from the power amplifying unit.

FIG. 1 is a view showing an example of the schematic arrangement of the polar modulating circuit according to a first embodiment of this invention. As seen from FIG. 1, this polar modulating circuit includes a power amplifying unit 105, a polar coordinate converting unit 106, an amplitude controller unit 109 composed of an amplitude information correcting unit 107 and an amplitude modulating unit 108, a phase-modulated signal generating unit 112 composed of a phase information correcting unit 110 and a phase modulating unit 111, a memory 101, a delay quantity determining unit 102, and delay adjusting units 103, 104.

In the case where the polar modulating circuit according to this invention is used in a transmission device, the polar coordinate converting unit 106 separates the I/Q signals (I, Q), which are the transmitted data supplied from a baseband signal generating unit of the transmission device not shown, into an amplitude signal r and a phase signal θ with a constant amplitude. Now, for example, the amplitude signal r(t) is normalized so as to give a maximum value of 1.

The amplitude information correcting unit 107 makes a correction to the input amplitude signal on the basis of the amplitude correction signal supplied from the memory 101. The amplitude modulating unit 108 drives the control voltage for the power amplifying unit 105 at a high speed on the basis of the output signal from the amplitude information correcting unit 107.

The phase information correcting unit 110 makes a correction for the input phase signal on the basis of the phase correction signal supplied from the memory 101. The phase modulating unit 111 generates a phase modulated signal in a radio frequency band on the basis of the output signal from the phase information correcting unit 110 and supplies it to the power amplifying unit 105.

The power amplifying unit 105 receives the phase-modulated signal supplied from the phase modulating unit 111 as an input high frequency signal and receives the amplitude-modulated signal supplied from the amplitude modulating unit 108 as a control signal, thereby generating a transmitted data in the radio frequency band.

Transmission level information S1 is information for determining the average output level from an antenna (not shown) arranged at the rear stage of the power amplifying unit 105, which is transmitted from the control unit (not shown) of the transmitter device where the polar modulating circuit according to this invention is used in the transmission device. The transmission level information S1 is supplied to the memory 101 and the delay quantity determining unit 102. Now, the transmission level corresponds to the antenna output level defined by 2 dB step between 33 dBm and 5 dBm in the case of a moving station which is making the transmission in the 8-PSK modulation in e.g. a GSM band in 900 MHz band.

With a predetermined input high frequency signal amplitude being applied to the power amplifying unit 105, the memory 101 stores the AM-AM characteristic and AM-PM characteristic for a control signal to be supplied to the power amplifying unit 105.

Further, using, as a reference signal, the amplitude signal r(t) supplied from the polar coordinate converting unit 106, the memory 101 accesses the AM-AM characteristic and AM-PM characteristic stored, supplies an amplitude correction signal Rcomp(t) which provides a reverse characteristic of the above AM-AM characteristic to the amplitude information correcting unit 107 and supplies a phase correction signal Tcomp(t) which provides a reverse characteristic of the above AM-PM characteristic to the phase information modulating unit 110.

Further, the memory 101 performs normalizing processing of the AM-AM characteristic on the basis of the transmission level information S1. Concretely, on the basis of the maximum transmission power considering the maximum value—average value (peak factor) of the amplitude information corresponding to a modulating system for a desired output level (average value), the memory 101 performs the normalizing of the output signal amplitude in the stored AM-AM data, thereby making the correction for the desired output level. By this normalization, using the input amplitude information r(t) as an addressing signal, the AM-AM data can be accessed.

From a data table, the delay quantity determining unit 102 refers to the delay quantity previously acquired corresponding to the amplitude value of the amplitude signal r(t) supplied from the polar coordinate converting unit 106 and the transmission level information S1, thereby computing synchronization divergence between the amplitude signal r and the phase signal θ. The delay quantity determining unit 102 supplies delay quantity information for correcting the synchronization divergence to the delay adjusting units 103, 104. The detailed operation of the delay quantity determining unit 102 will be described later.

The delay adjusting unit 103, on the basis of the delay quantity information transmitted from the delay quantity determining unit 102, generates a phase signal θ(t−τ) delayed by a time τ from the phase signal θ(t) produced from the polar coordinate converting unit 106, and supplies it to the phase information correcting unit 110.

The delay adjusting unit 104, on the basis of the delay quantity information transmitted from the delay quantity determining unit 102, generates another phase correction signal Tcomp(t−τ) delayed by a time τ from the phase correction signal Tcomp(t) transmitted from the memory 101, and supplies it to the phase information correcting unit 110.

Now, since the delay adjusting unit 104 gives the same delay quantity as the delay adjusting unit 103 does, the synchronization between the phase signal and the phase information correction signal which are the input signals to the phase information correcting unit 110 is assured.

Figure 2:
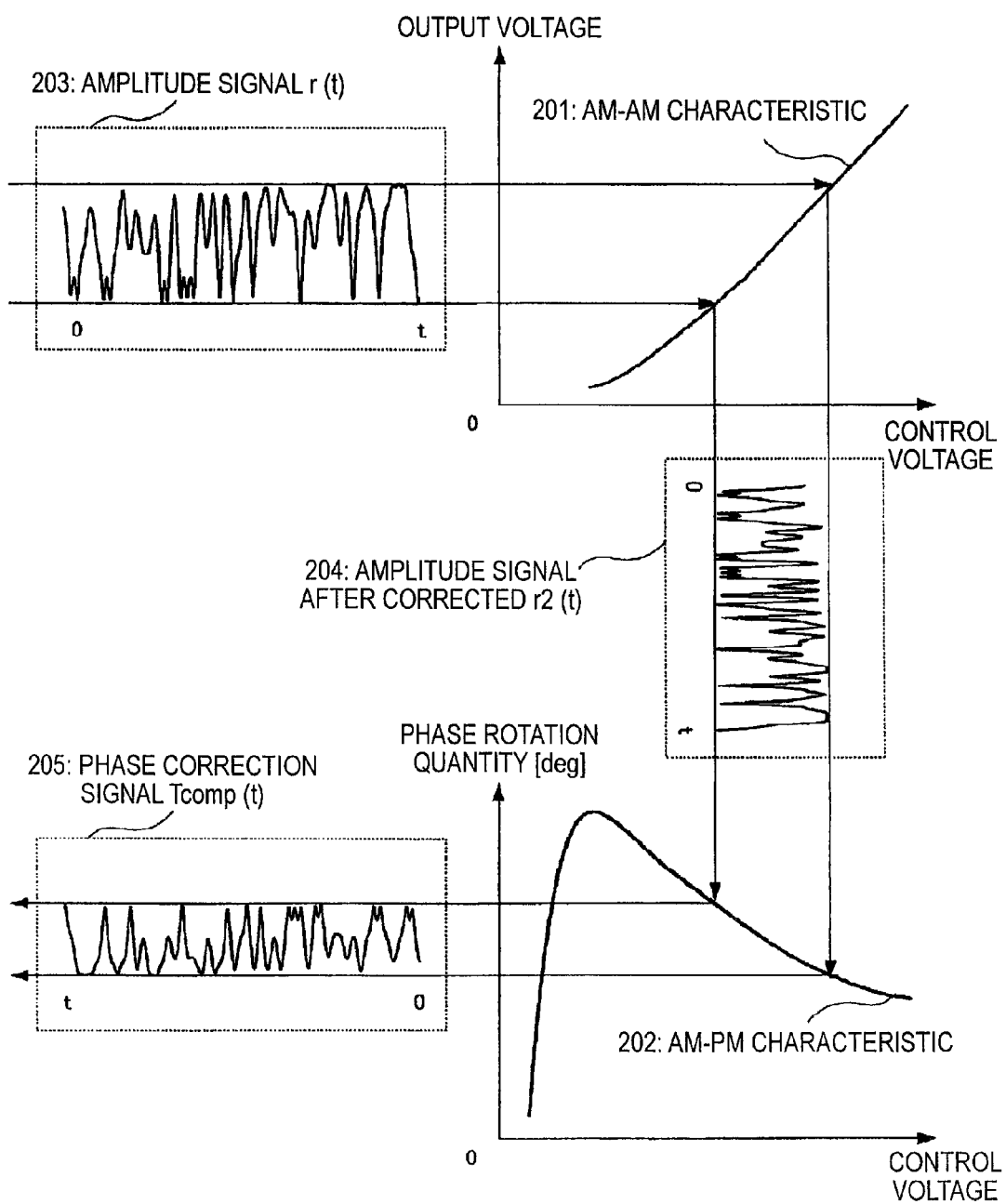
FIG. 2 is a graph showing the AM-AM characteristic and AM-PM characteristic in a power amplifying unit according to the first embodiment of this invention.

Next, referring to FIG. 2, an explanation will be given of an example of the method for correcting the amplitude signal and the phase signal. FIG. 2 is a graph showing an example of the AM-AM characteristic and AM-PM characteristic of the power amplifying unit 105.

In FIG. 2, an AM-AM characteristic 201 represents the output voltage characteristic (AM-AM characteristic) for the control voltage; and an AM-PM characteristic 202 represents the passing phase characteristic (AM-PM characteristic) for the control voltage. These characteristics can be easily acquired using e.g. a network analyzer. FIG. 2 illustrates the relationship among the output voltage, control voltage and phase rotation quantity in a desired power amplifying unit 105 and also illustrates an example of the method of distortion compensation.

Specifically, as regards the AM-AM characteristic 201, converting it from the output voltage axis to the control voltage axis means acquisition of the reverse characteristic of the AM-AM characteristic 201. Thus, the signal outputted from the polar coordinate converting unit 106 represents an amplitude signal after corrected r2(t) 204 acquired from the reverse characteristic of the AM-AM characteristic 201 so that the distortion compensation of the amplitude signal can be made.

Further, as regards the AM-PM characteristic 202, since the amplitude signal r2(t) after corrected is the control voltage to be supplied to the power amplifying unit 105, by converting it the control voltage axis to the phase rotation quantity axis, the phase correction signal Tcomp(t) 205 transmitted from the memory 101 can be acquired. By subtracting the phase correction signal Tcomp(t) 205 from the input phase signal, distortion compensation of the phase signal can be made.

In accordance with the construction described above, as the first advantage of the first embodiment of this invention, the amplitude-modulated signal and phase-modulated signal which have been previously distorted considering the reverse characteristic of the output characteristic for the input control signal to the power amplifying unit will be affected by actual distortions in the amplitude and phase by considering the delay quantity generated in the power amplifying unit, thereby providing a desired output amplitude and phase. Thus, the linearity of the output signal for the input control voltage can be improved.

Figure 3:
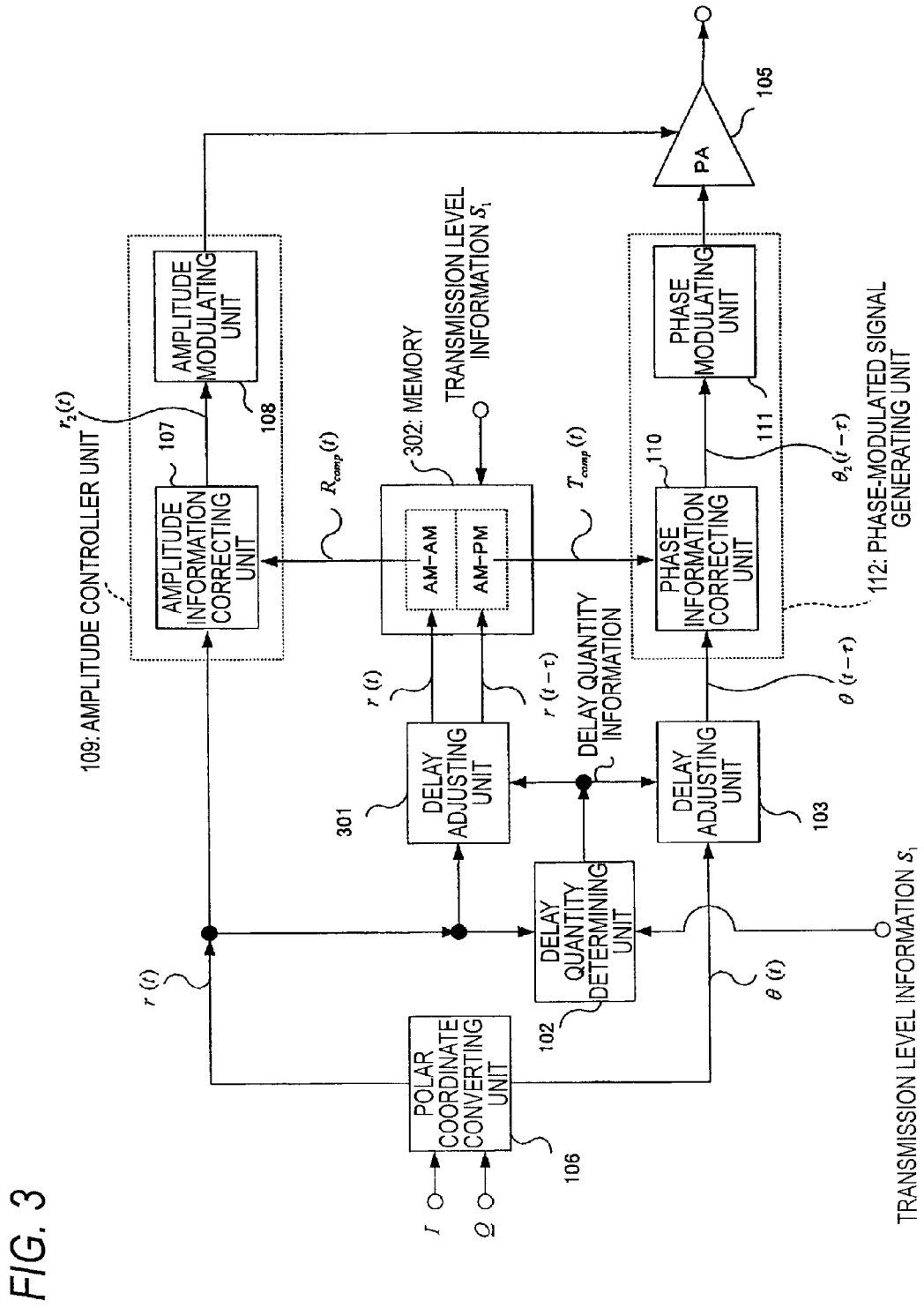
FIG. 3 is a view showing another arrangement of the polar modulating circuit according to a first embodiment of this invention.

Further, as another example of the transmission device according to the first embodiment, the arrangement as shown in FIG. 3 can be proposed.

FIG. 3 is a view showing another example of the schematic arrangement of the polar modulating circuit according to a first embodiment of this invention. As seen from FIG. 3, this polar modulating circuit includes a power amplifying unit 105, a polar coordinate converting unit 106, an amplitude controller unit 109 composed of an amplitude information correcting unit 107 and an amplitude modulating unit 108, a phase-modulated signal generating unit 112 composed of a phase information correcting unit 110 and a phase modulating unit 111, a delay quantity determining unit 102, delay adjusting units 103, 301, and a memory 302. In the polar modulating circuit shown in FIG. 1, the delay quantity adjusting unit 301 is substituted for the quantity adjusting unit 104 and the memory 302 is substituted for the memory 101. The components overlapping those in the polar modulating circuit shown in FIG. 1 are denoted by like symbols.

Transmission level information S1 is the transmission level information for the power amplifying unit 105, which is transmitted from the control unit (not shown) of the transmission device where the polar modulating circuit according to this invention is used in the transmission device. The transmission level information S1 is supplied to the memory 302 and the delay quantity determining unit 102.

The delay adjusting unit 301, on the basis of the delay quantity information transmitted from the delay quantity determining unit 102, generates an amplitude signal r(t−τ) delayed by a time τ from the amplitude signal r(t) produced from the polar coordinate converting unit 106. The delay adjusting unit 301 supplies, to the memory 302, the amplitude signal r(t−τ) as a reference signal for the AM-PM characteristic and the amplitude signal r(t) as a reference signal for the AM-AM characteristic.

Now, the delay time τ given to the reference signal with the AM-PM characteristic is made equal to the delay time τ given to the phase signal θ(t) transmitted from the polar coordinate converting unit 106 by the delay adjusting unit 103. In this way, the synchronization between the phase signal and the phase information correction signal which are the input signals to the phase information correcting unit 110 is assured.

The memory 302 stores the AM-AM characteristic and AM-PM characteristic for an input control signal to the power amplifying unit 105 when the high frequency signal with a predetermined amplitude is supplied thereto. Further, using, as a reference signal, the one amplitude signal r(t) of the signals from the delay adjusting unit 301, the memory 302 accesses the AM-AM characteristic, and supplies an amplitude corrected signal Rcomp(t) which provides a reverse characteristic of the above AM-AM characteristic to the amplitude information correcting unit 107. In addition, using, as a reference signal, the other amplitude signal r(t−τ) of the signals from the delay adjusting unit 301, the memory 302 accesses the AM-PM characteristic, and supplies a phase corrected signal Tcomp(t) which provides a reverse characteristic of the above AM-PM characteristic to the phase information modulating unit 110.

Further, the memory 302 performs normalizing processing of the AM-AM characteristic on the basis of the same transmission level information S1 as that for the memory 101. This has been explained with reference to FIG. 1 and so will not be explained here. Incidentally, the other requisites in FIG. 3 are the same as the operation in FIG. 1 and so will not be explained here. By adopting the construction described above, the same effect as the polar modulating circuit shown in FIG. 1 can be obtained.

Next, a detailed explanation will be give of the operation of the delay quantity determining unit 102. Prior to this, an explanation will be given of the features of the power amplifying unit 105 used in the polar modulating system.

Figure 4:
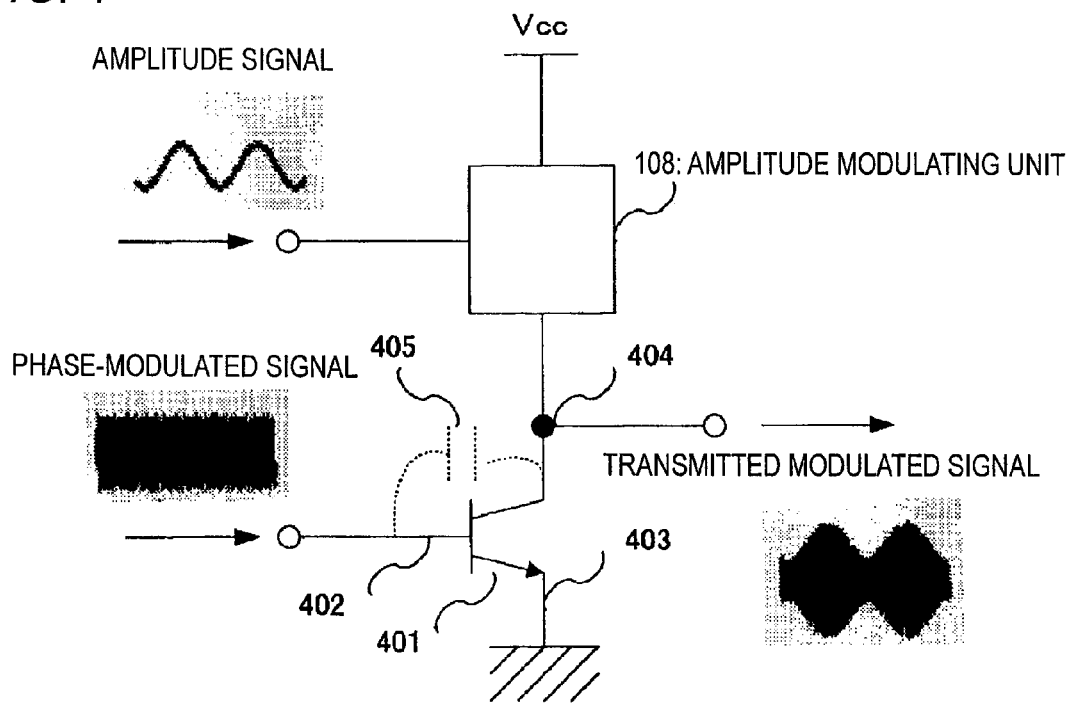
FIG. 4 is a view showing an arrangement of the power amplifying unit according to the first embodiment of this invention.

FIG. 4 is a peripheral block diagram of the power amplifying unit 105 in the polar modulating system. In FIG. 4, a transistor 401 constituting the power amplifying unit 105 is composed of a base terminal 402, an emitter terminal 403 and a collector terminal 404. A depletion layer capacitor 405 is generated between the base terminal 402 and collector terminal 404 of the transistor 401. In this example, for simplicity of illustration, the power amplifying unit 105 is constructed of one stage of the transistor 401.

In the power amplifying unit 105 used in the polar modulating system, signals are supplied as shown in FIG. 4. Specifically, the phase-modulated signal acquired by carrier-modulating the baseband signal is supplied to the base terminal 402, and the baseband signal is supplied to the collector terminal 404. Now, generally, the frequencies of the baseband signal and the carrier signal are greatly different from each other.

In this case, the collector potential of the collector terminal 404 changes according to a control signal for the transistor 401 generated by the amplitude-modulating unit 108 on the basis of the amplitude signal in the baseband, i.e. the amplitude signal in FIG. 4. Thus, the depletion layer capacitor 405 changes. Particularly, where control is made to lower the average potential of the collector terminal 404 in order to reduce the output average power from the transistor 401, the depletion layer capacitor 405 increases.

The inventors of this invention have taken notice of the fact that in the polar modulating system, the input signal to the base terminal 402 and the input signal to the collector terminal 404 are different in their frequencies, and the depletion layer capacitor 405 between the base terminal 402 and the collector terminal 404 changes according to changes in the control voltage. In this case, under the influence of the changes in the depletion layer capacitor 405 corresponding to the amplitude of the control voltage, the relative delay quantity between the phase-modulated signal supplied to the base terminal 402 and the amplitude-modulated signal changes.

Concretely, in the example of FIG. 4, even if synchronization is taken when the control voltage at the maximum value level of the amplitude signal is applied, the capacitance of the depletion layer capacitor 405 at the maximum value level of the amplitude signal is different from that at the minimum value level thereof so that the capacitance at the minimum value level becomes larger than that at the maximum value level. This leads to a mechanism that at the minimum value level of the amplitude signal, the delay quantity of the amplitude signal becomes larger than that at the maximum value level of the amplitude signal so that the synchronization will be lost.

In the radio system for performing control of a transmitted power, changes of the capacitance further increase. Accordingly, the synchronization must be taken again at the maximum transmitted power level and the at the minimum transmitted power level.

In avoid such an inconvenience, by adjusting the synchronization according the amplitude of the control voltage for the power amplifying unit 105, the cause of synchronization divergence at the other point than the signal changing point could be dealt with and the system for feeding back the output signal from the power amplifying unit 105 could be made unnecessary.

Figure 5:
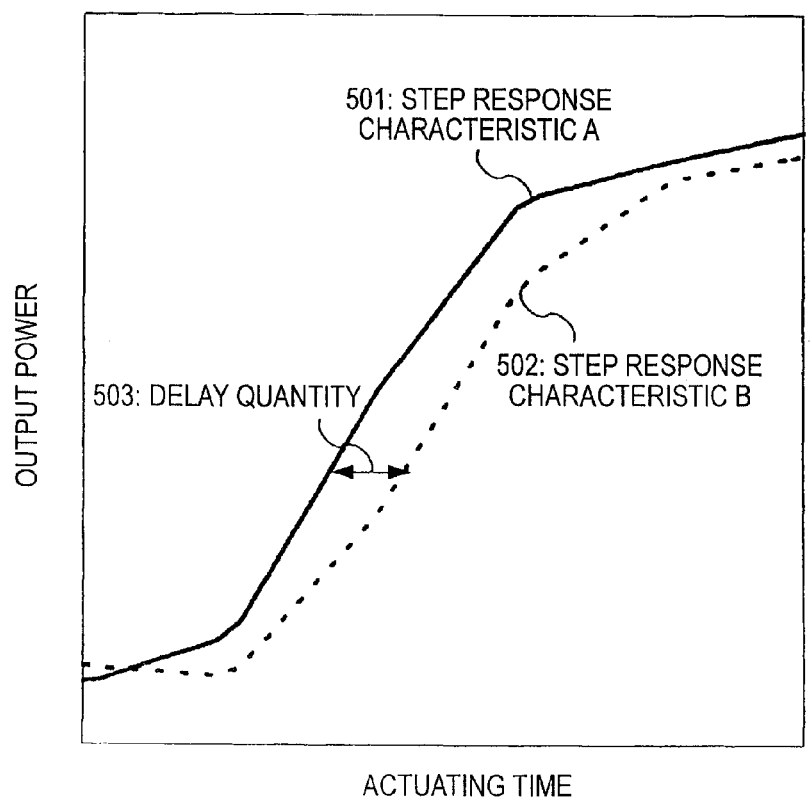
FIG. 5 is a graph showing the step response characteristic in the power amplifying unit according to the first embodiment of this invention.

Next, the operation of the delay quantity determining unit 102 will be explained. As described above, the synchronization divergence occurs according to the amplitude of the control voltage supplied to the power amplifying unit 105. So, the delay occurring according to the amplitude of the control voltage (output signal from the amplitude modulating unit 108) was acquired. FIG. 5 shows a step response characteristic when a fixed control voltage is applied to the power amplifying unit 105 in order to provide an output level with a constant value. In FIG. 5, the abscissa represents an actuating time until a desired output level is reached after the control voltage has been applied; and the ordinate represents the output power from the power amplifying unit 105.

Further, step response characteristic A501 and step response characteristic B502 indicate the step response characteristics when the output power level is lowered in the order of the step response characteristic A501 and step response characteristic B502. Delay quantity 503 represents the delay quantity occurring between the step response characteristic A501 and step response characteristic B502.

In the example shown in FIG. 5, two kinds of step response characteristics are presented for the control voltage level (output power level) inputted to the collector terminal 404. However, the step response characteristics when the control voltage is applied at finer intervals and over a wider range can be previously acquired. In this case, for example, at the time of the maximum value level among the target transmission average power levels of the radio system, the synchronization between the amplitude signal and the phase signal is taken. When the transmission level is controlled, on the basis of the delay quantity 503 for each of the control voltage values (output powers) previously acquired as described above, the delay adjustment according to the change in the transmission level is made. Even at the same transmission level, if the delay adjustment is made according to the amplitude value of the control signal representing the amplitude component of the modulated signal, the synchronization can be more precisely.

More specifically, in the delay quantity determining unit 102, the delay quantity 503 acquired as described above is prepared as a table data relative to the amplitude value of the amplitude signal or the transmission level information S1. Using, as the reference signal, the amplitude value of the amplitude signal or transmission level information S1, the delay quantity information is transmitted to the delay adjusting unit. Thus, the synchronization between the amplitude signal and the phase signal can be adjusted.

Additionally, in order to deal with the signal changing point of the amplitude signal r(t), in the delay quantity determining unit 102, the amplitude signal is sampled within a predetermined time and the relationship between the sampled values is acquired, thereby assuring the synchronization at the signal changing point. For example, subtraction is made between the previously sampled value and the present sampled value. If the sign of the computed result is inverted, this point is determined as the signal changing point.

As described above, in accordance with the first embodiment of this invention, on the basis of the step response characteristic of the power amplifying unit 105, the delay quantity information corresponding to the amplitude value of the amplitude signal and the transmission level information S1 is stored as the table data in the delay quantity determining unit 102, and the delay quantity of the phase-modulated signal is adjusted according to the amplitude of the amplitude signal. Thus, as the second effect of the first embodiment of this invention, the problem of synchronization divergence in composing the phase-modulated signal and the amplitude-modulated signal, which could not be solved by the prior art and is attributed to changes in the amplitude value of the amplitude signal including the signal changing point, can be solved without using the system of branching and feeding back the output signal from the power amplifying unit 105.

Incidentally, since the delay quantity changes according to the carrier frequency and baseband frequency, the table data corresponding to the carrier frequency or the baseband signal bandwidth may be prepared. It is needless to say that by adjusting the delay quantity on the basis of the carrier frequency information transmitted from the control unit of the transmission device not shown or the system information equivalent to the baseband bandwidth, the synchronization can be assured more precisely.

Further, in the first embodiment of this invention, the delay adjusting unit was inserted in the phase signal path and correspondingly, the delay adjusting unit was also inserted in the phase correction signal generating path. Without being limited to such an arrangement, the delay adjusting units may be inserted in the amplitude signal path and the amplitude correction signal generating path. It is needless to say that the delay adjusting units may be inserted in the amplitude signal path and amplitude correction signal generating path, and the phase signal path and the phase correction signal generating path, respectively.

Incidentally, in the first embodiment of this invention, explanation was given of the method for assuring the synchronization without using the feedback system of branching the output signal from the power amplifier. However, it is needless to say that the above method can be employed in combination with the polar modulating circuit provided with the feedback circuit for the other purpose than assuring synchronization.

Further, where the polar modulating circuit according to the first embodiment of this invention is used in the transmission device, a DA converter (not shown) is arranged between the stages of the amplitude information correcting unit 107 and amplitude modulating unit 108 and between the stages of the phase information correcting unit 110 and phase modulating unit 111 in FIG. 1 or FIG. 3.

Embodiment 2

The second embodiment of this invention will explain a circuit configuration capable of reducing the circuit scale as compared with the first embodiment of this invention.

Figure 6:
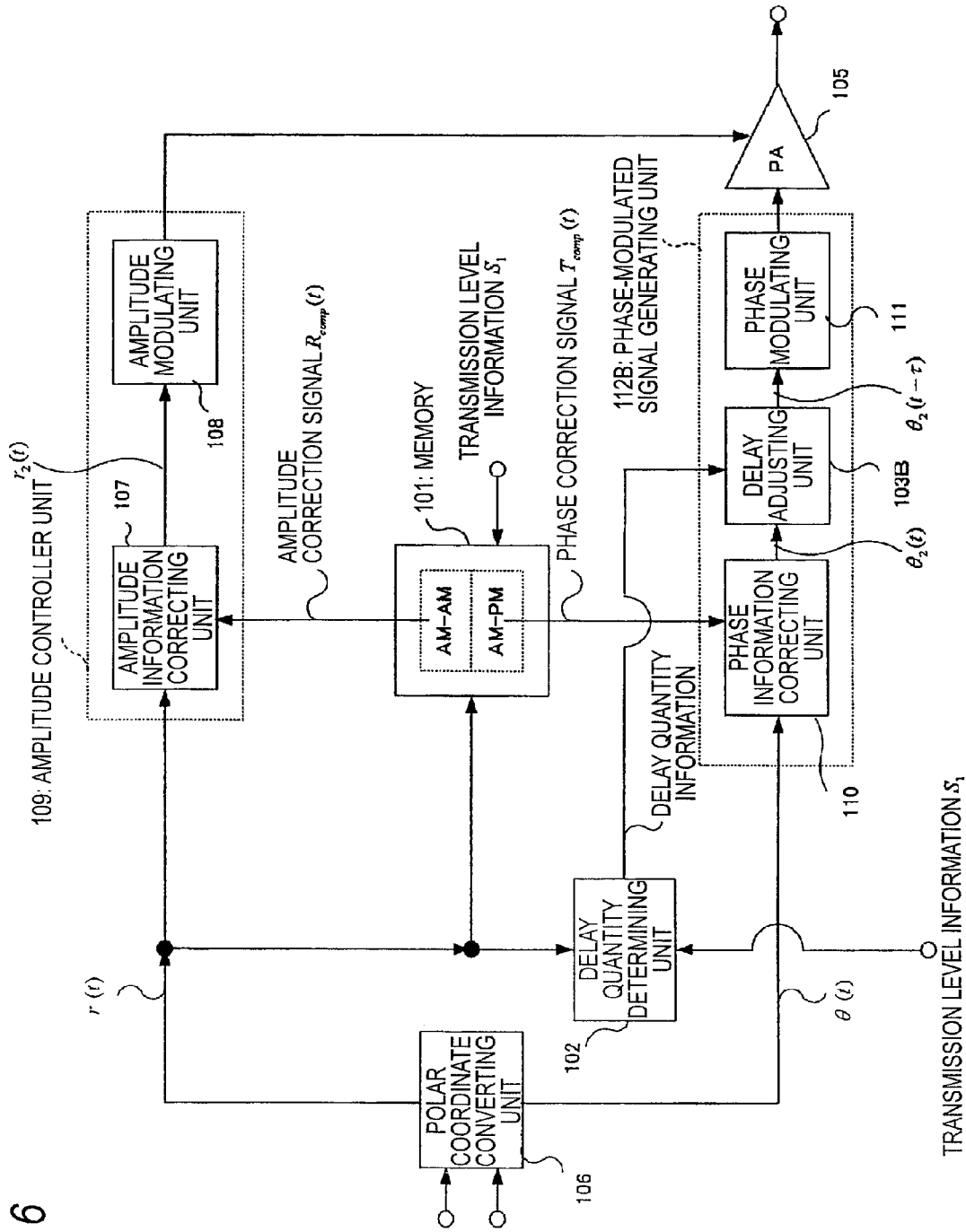
FIG. 6 is a view showing an arrangement of the polar modulating circuit according to a second embodiment of this invention.

FIG. 6 is a view showing an example of the schematic arrangement of the polar modulating circuit according to a second embodiment of this invention. As seen from FIG. 6, this polar modulating circuit includes a power amplifying unit 105, a polar coordinate converting unit 106, an amplitude controller unit 109 composed of an amplitude information correcting unit 107 and an amplitude modulating unit 108, a phase-modulated signal generating unit 112B composed of a phase information correcting unit 110, a delay adjusting unit 103B and a phase modulating unit 111, a delay quantity determining unit 102, and a memory 101. In the polar modulating circuit shown in FIG. 1 showing the first embodiment of this invention, in place of the delay adjusting unit 103 located between the stages of the polar coordinate converting unit 106 and phase information correcting unit 110, the delay adjusting unit 103B is arranged between the stages of the phase information correcting unit 110 and phase modulating unit 111; and in addition, the delay adjusting unit 104 is removed. The components overlapping those in the polar modulating circuit shown in FIG. 1 are denoted by like symbols.

From a data table, the delay quantity determining unit 102 refers to the delay quantity previously acquired corresponding to the amplitude value of the amplitude signal r(t) supplied from the polar coordinate converting unit 106 and the transmission level information S1. The delay quantity determining unit 102 thereby computes synchronization divergence between the amplitude signal r and the phase signal θ and supplies delay quantity information for correcting the synchronization divergence to the delay adjusting units 103B. The operation of the delay quantity determining unit 102, which has been already explained with reference to the first embodiment, will not be explained again.

The delay adjusting unit 103B, on the basis of the delay quantity information transmitted from the delay quantity determining unit 102, generates another phase signal θ2(t–τ) delayed by a time τ from the phase signal θ2(t) after phase-corrected, produced from the phase information correcting unit 110, and supplies it to the phase modulating unit 111.

Additionally, the other requisites in FIG. 6 are the same as the operation in FIG. 1 and so will not be explained here. By adopting the construction described above, the same effect as the polar modulating circuit shown in FIG. 1 can be obtained, and the circuit scale can be reduced as compared with the polar modulating circuit shown in FIG. 1.

Incidentally, in the second embodiment of this invention, the delay adjusting unit 103B was inserted in the phase signal path. However, without being limited to such an arrangement, the delay adjusting unit 103B may be inserted in the amplitude signal path and further inserted in both paths of the amplitude signal path and phase signal path.

Further, where the polar modulating circuit according to the second embodiment of this invention is used in the transmission device, a DA converter (not shown) is arranged between the stages of the amplitude information correcting unit 107 and amplitude modulating unit 108 and between the stages of the delay adjusting unit 103B and phase modulating unit 111 in FIG. 6. However, it should be noted that where the delay adjusting unit 103B is constructed of an analog circuit, the DA converter not shown is arranged between the stages of the phase information correcting unit 110 and delay adjusting unit 103B.

Embodiment 3

The third embodiment of this invention explains the case where an orthogonal modulator is adopted as the phase modulating unit in the second embodiment of this invention.

Figure 7:
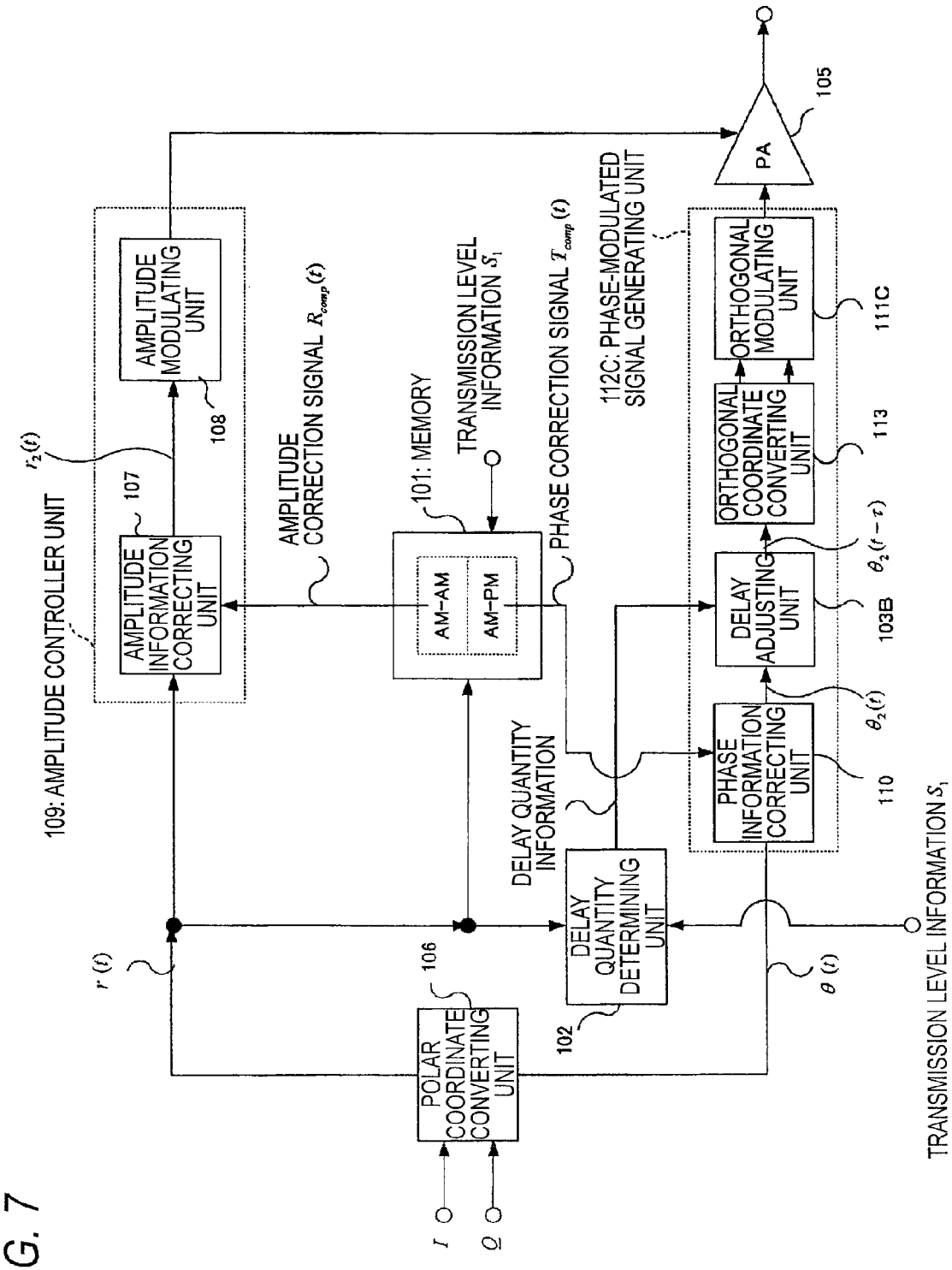
FIG. 7 is a view showing an arrangement of the polar modulating circuit according to a third embodiment of the invention.

FIG. 7 is a view showing an example of the schematic arrangement of the polar modulating circuit according to a third embodiment of this invention. As seen from FIG. 7, this polar modulating circuit includes a power amplifying unit 105, a polar coordinate converting unit 106, an amplitude controller unit 109 composed of an amplitude information correcting unit 107 and an amplitude modulating unit 108, a phase-modulated signal generating unit 112C composed of a phase information correcting unit 110, a delay adjusting unit 103B, an orthogonal coordinate converting unit 113 and an orthogonal modulating unit 111C, a delay quantity determining unit 102, and a memory 101. In the polar modulating circuit of FIG. 6 showing the second embodiment of this invention, the orthogonal coordinate converting unit 113 is added and the orthogonal modulating unit 111c is substituted for the phase modulating unit 111. The components overlapping those in the polar modulating circuit shown in FIG. 6 are denoted by like symbols.

The delay adjusting unit 103B, on the basis of the delay quantity information transmitted from the delay quantity determining unit 102, generates phase information θ2(t–τ) delayed by a time τ from the phase signal θ2(t) after phase-corrected, produced from the phase information correcting unit 110, and supplies it to the orthogonal coordinate converting unit 113.

The orthogonal coordinate converting unit 113, on the basis of the phase information θ2(t–τ) produced from the delay adjusting unit 103B, generates orthogonal signals having prescribed amplitude values, and supplies them to the orthogonal modulating unit 111C.

The orthogonal modulating unit 111C, on the basis of the orthogonal signals produced from the orthogonal coordinate converting unit 113, generates a phase-modulated signal in a radio frequency band and supplies it to the power amplifying unit 105.

The power amplifying unit 105 receives the phase-modulated signal produced from the orthogonal modulating unit 111C as the input high frequency signal and receives the amplitude-modulated signal produced from the amplitude modulating unit 108 as the control signal, thereby generating the transmitted data in the radio frequency band.

Additionally, the other requisites in FIG. 7 are the same as the operation in FIG. 6 and so will not be explained here. By adopting the construction described above, the polar modulating circuit can be constructed using the orthogonal modulator.

Incidentally, in the third embodiment of this invention, the delay adjusting unit 103B was inserted in the phase signal path. However, without being limited to such an arrangement, the delay adjusting unit 103B may be inserted in the amplitude signal path and further inserted in both paths of the amplitude signal path and phase signal path.

Further, where the polar modulating circuit according to the third embodiment of this invention is used in the transmission device, a DA converter (not shown) is arranged between the stages of the amplitude information correcting unit 107 and amplitude modulating unit 108 and between the stages of the orthogonal coordinate converting unit 113 and orthogonal modulating unit 111C in FIG. 7.

Embodiment 4

The fourth embodiment of this invention will explain an example of the circuit configuration of the delay adjusting unit in the first to third embodiments of this invention. The fourth embodiment of this invention also will explain the delay adjusting operation using the above delay adjusting unit.

Referring to FIG. 6, an explanation will be given of an example of the schematic arrangement of the polar modulating circuit according to the fourth embodiment of this invention. FIG. 6 has been explained in connection with the second embodiment of this invention, and so the overlapping explanation will be not given.

Where the transmission device is constructed using the polar modulating circuit shown in FIG. 6, the digital signal processing unit is operated with reference to a clock having a prescribed frequency. For this reason, by using a general delay circuit in a digital circuit, the delay adjustment (first delay adjusting unit) in units of the period of the above reference clock can be easily made.

Further, by frequency-dividing the reference clock so as to shorten its period, the delay adjustment can be made with high precision. However, by operating the frequency divider or operating the digital circuit at a high speed, current consumption will increase. Thus, there is a relationship of trade-off between the high precision of the delay adjustment by frequency-division of the reference clock and the current consumption.

Now, the delay adjusting unit in the first to third embodiments of this invention is characterized in that it realizes a delay adjustment step shorter than the unit of the period of the reference clock, thereby making the delay adjustment at a high precision according to the output signal from the delay quantity determining unit. Therefore, it is necessary to acquire the delay adjustment step shorter than the unit of the period of the reference clock using the method other than frequency division of the reference clock.

So, an explanation will be given of an example of acquiring the delay adjustment step shorter than the unit of the period of the reference clock by means of arithmetic processing.

Now, it is assumed that the one period of the reference clock is $\tau_{clk}$. In addition, it is assumed that the amplitude values of the phase signal at a time $(t-n \times \tau_{clk})$ and a time $(t-(n+1) \times \tau_{clk})$ delayed by n periods of the reference clock and (n+1) periods thereof (n represents an integer of 0 or larger) from a time t are $\theta(t\_n)$ and $\theta(t\_n+1)$. Now, assuming that the delay time shorter than the one period is $\tau_d$, if $\tau_{clk}$ is sufficiently short, the amplitude value of the phase signal at a time $(t-(n \times \tau_{clk}+\tau_d))$ can be approximated by the following Equation (1).

[Equation 1]

$$\theta(t\_n+\tau_d/\tau_{clk})=\theta(t\_n+1) \times \tau_d+\theta(t\_n) \times (1-\tau_d) \quad (1)$$

Figure 8:
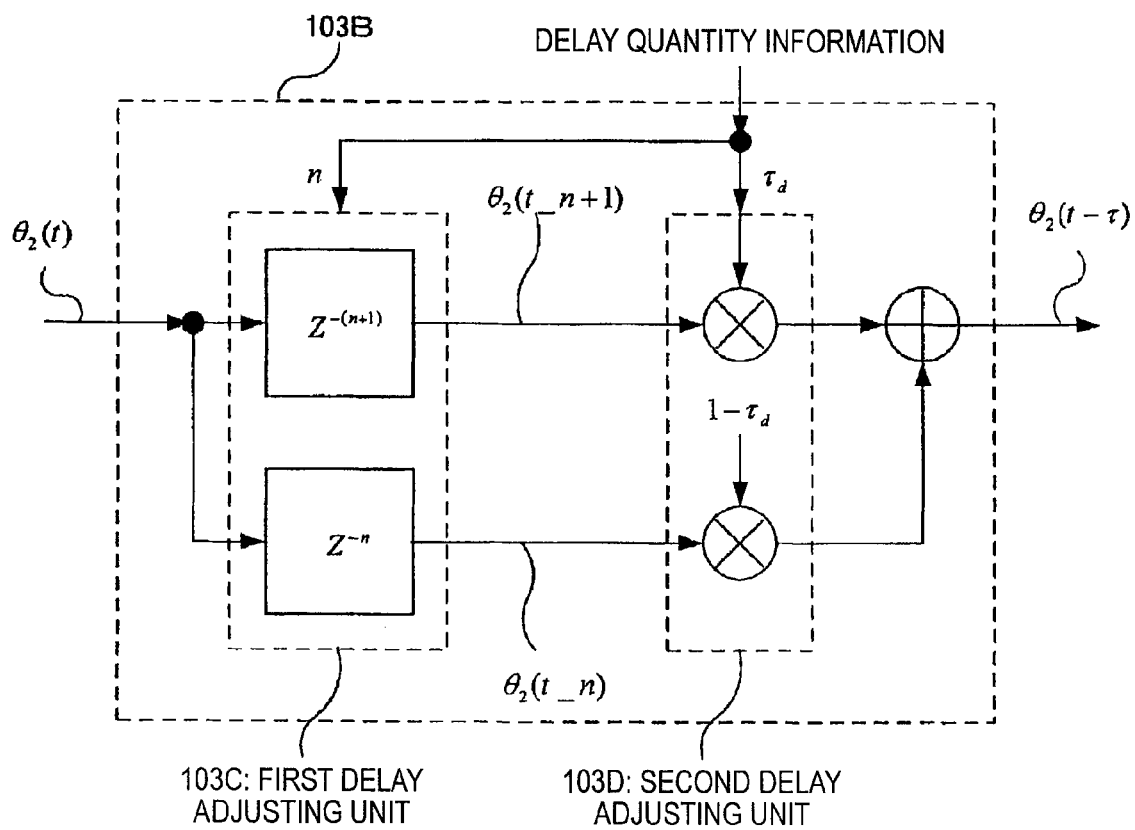
FIG. 8 is a view showing an arrangement of the delay adjusting unit according to a fourth embodiment of the invention.

An exemplary arrangement of the delay adjusting unit 103B for realizing Equation (1) is shown in FIG. 8. Now, assuming that a prescribed quantity of delay adjustment is $\tau(=n \times \tau_{clk}+\tau_d)$, the delay adjustment corresponding to the n periods of the reference clock is executed by a first delay adjusting unit 103C. A general delay circuit is expressed by $Z^{-n}$. The delay adjustment shorter than the unit of the reference clock is executed by a second delay adjusting unit 103D.

As described above, in the polar modulating circuit shown in FIG. 6, the delay adjusting unit 103B is constructed as shown in FIG. 8; and on the basis of the step response characteristic as shown in FIG. 5, n and $\tau_d$ corresponding to the amplitude signal or the transmission level information S1 is stored as the table data in the delay quantity determining unit 102, and the delay quantity of the phase-modulated signal is adjusted according to the amplitude of the amplitude signal. Thus, unlike the prior art, the delay difference between the paths of the phase signal and the amplitude signal can be precisely compensated for without using without using the system of branching and feeding back the output signal from the power amplifying unit 105.

Incidentally, the fourth embodiment of this invention proposed the method for acquiring a desired signal amplitude by linear interpolation from the signal amplitudes at two adjacent times. However, using the signal amplitudes at three or more times, by assigning weights to these signal amplitudes and adding them, and by considering whether the signal change is positive or negative, the accuracy of approximation can be improved.

Embodiment 5

The fifth embodiment of this invention will explain a circuit configuration capable of providing the operation equivalent to the delay adjusting unit in the first embodiment of this invention by the phase adjusting unit constructed of a multiplying circuit, and explain the circuit configuration capable of reducing the circuit scale as compared with the first embodiment of this invention.

Figure 9:
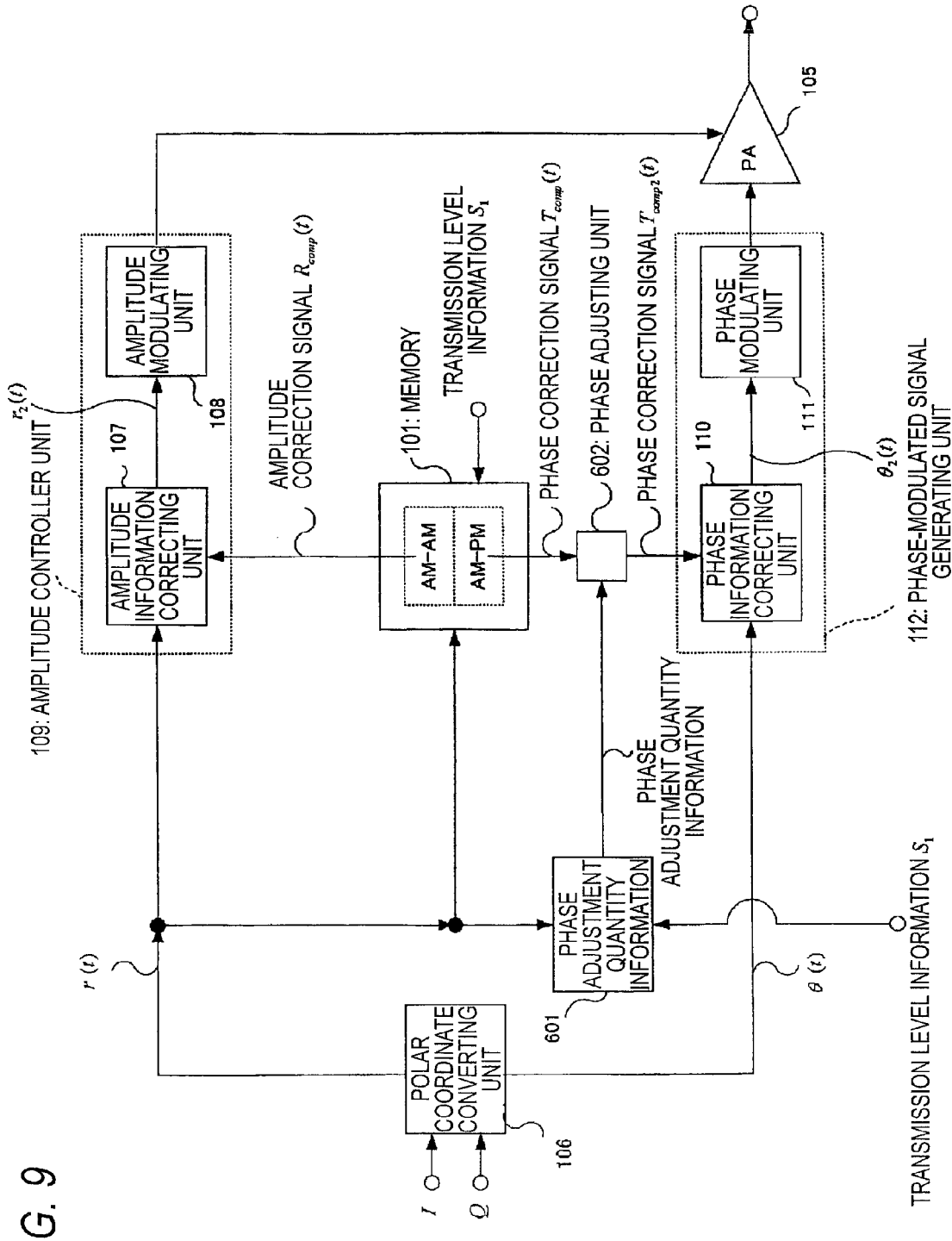
FIG. 9 is a view showing an arrangement of the polar modulating circuit according to a fifth embodiment of the invention.

FIG. 9 is a view showing an example of the schematic arrangement of the polar modulating circuit according to a fifth embodiment of this invention. As seen from FIG. 9, this polar modulating circuit includes a power amplifying unit 105, a polar coordinate converting unit 106, an amplitude controller unit 109 composed of an amplitude information correcting unit 107 and an amplitude modulating unit 108, a phase-modulated signal generating unit 112 composed of a phase information correcting unit 110 and a phase modulating unit 111, a memory 101, a phase adjustment quantity determining unit 601 and a phase adjusting unit 602. Namely, in the polar modulating circuit shown in FIG. 1, the delay adjusting unit 103 is removed, the delay quantity determining unit 102 is replaced by the phase adjustment quantity determining unit 601 and the delay adjusting unit 104 is replaced by the phase adjusting unit 602. The components similar to those in the polar modulating circuit of the first embodiment of the embodiment shown in FIG. 1 are denoted by like symbols.

Transmission level information S1 is the transmission level information of the power amplifying unit 105, which is transmitted from the control unit (not shown) where the polar modulating circuit according to this invention is used in the transmission device. The transmission level information S1 is supplied to the memory 101 and the phase adjustment quantity determining unit 601.

The phase adjustment quantity determining unit 601, on the basis of the amplitude signal r(t) produced from the polar coordinate converting unit 106 and the transmission level information S1, computes synchronization divergence between the amplitude signal r(t) and the phase signal θ, and the phase adjustment quantity equivalent to correction of the synchronization divergence to the phase adjusting unit 602. The detailed operation of the phase adjustment determining unit 601 will be explained later.

The phase adjusting unit 602, on the basis of the phase adjustment quantity information transmitted from the phase adjustment quantity determining unit 601, executes predetermined phase adjustment for the phase correction signal Tcomp(t) produced from the memory 101 to generate a phase correction signal Tcomp2(t), and supplies it the phase information correcting unit 110. The detailed operation of the phase adjusting unit 602 will be explained later. The other requisites in FIG. 9 are the same as the operation in FIG. 1 and so will not be explained here.

Figure 10:
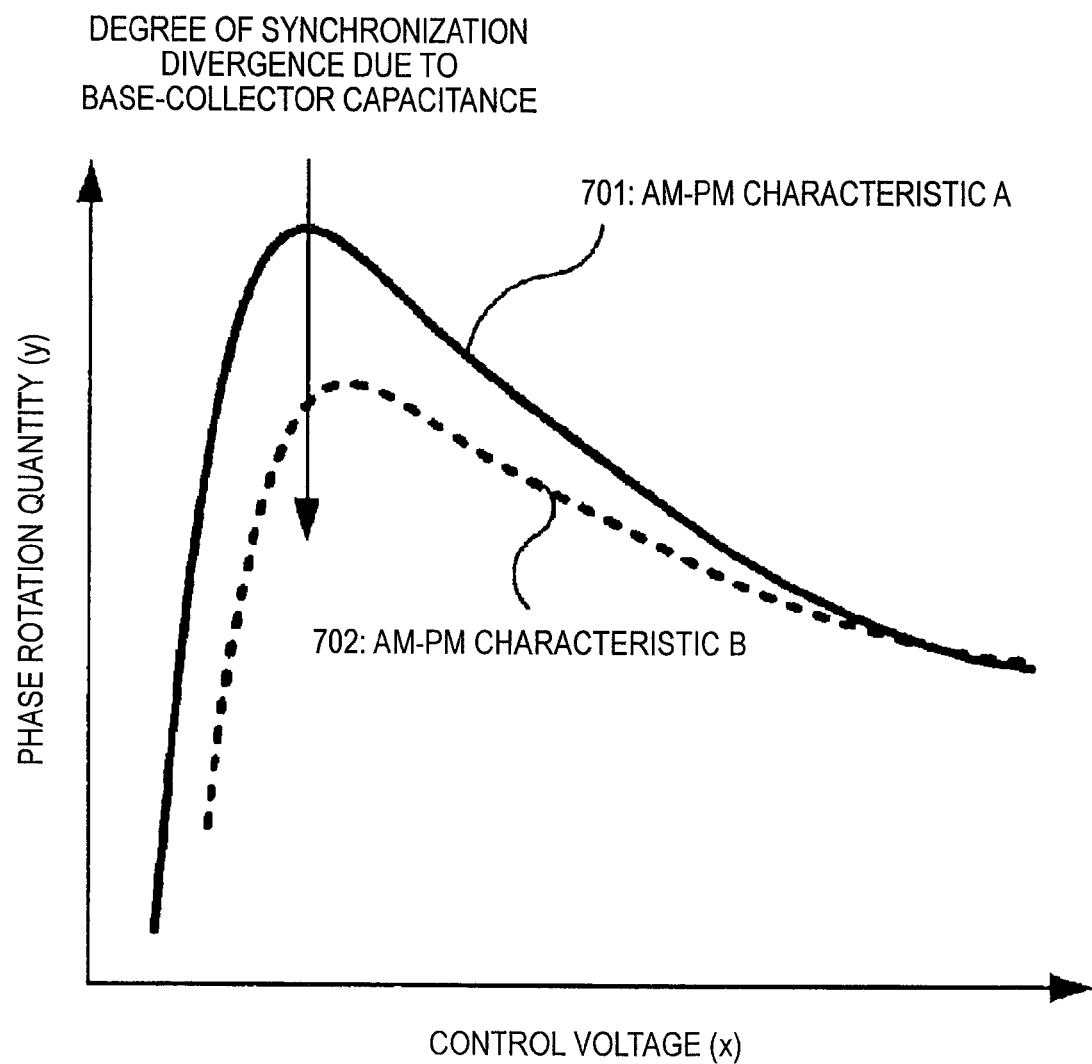
FIG. 10 is a graph showing the AM-PM characteristic of the power amplifying unit according to a fifth embodiment of the invention.
Figure 11:
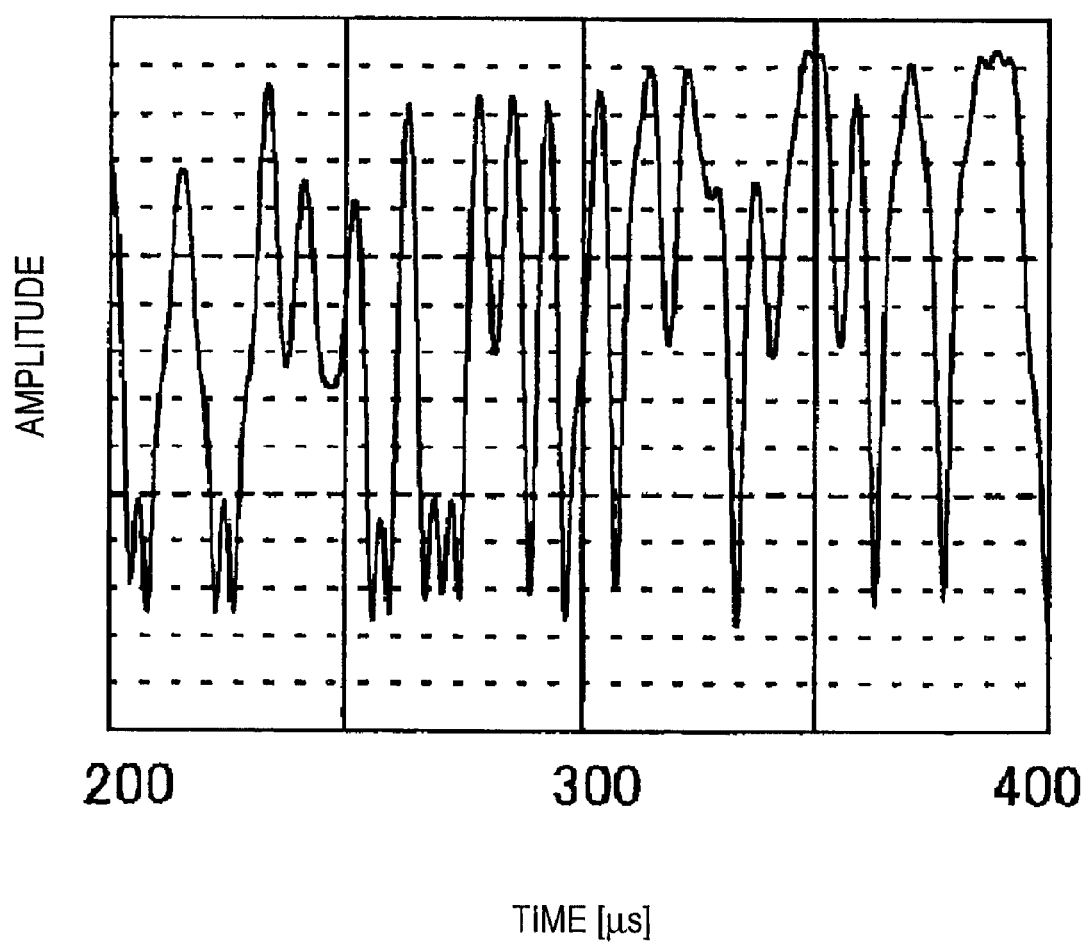
FIG. 11 is a graph showing an example of the amplitude signal in 8-PSK modulation according to a prior art.
Figure 12:
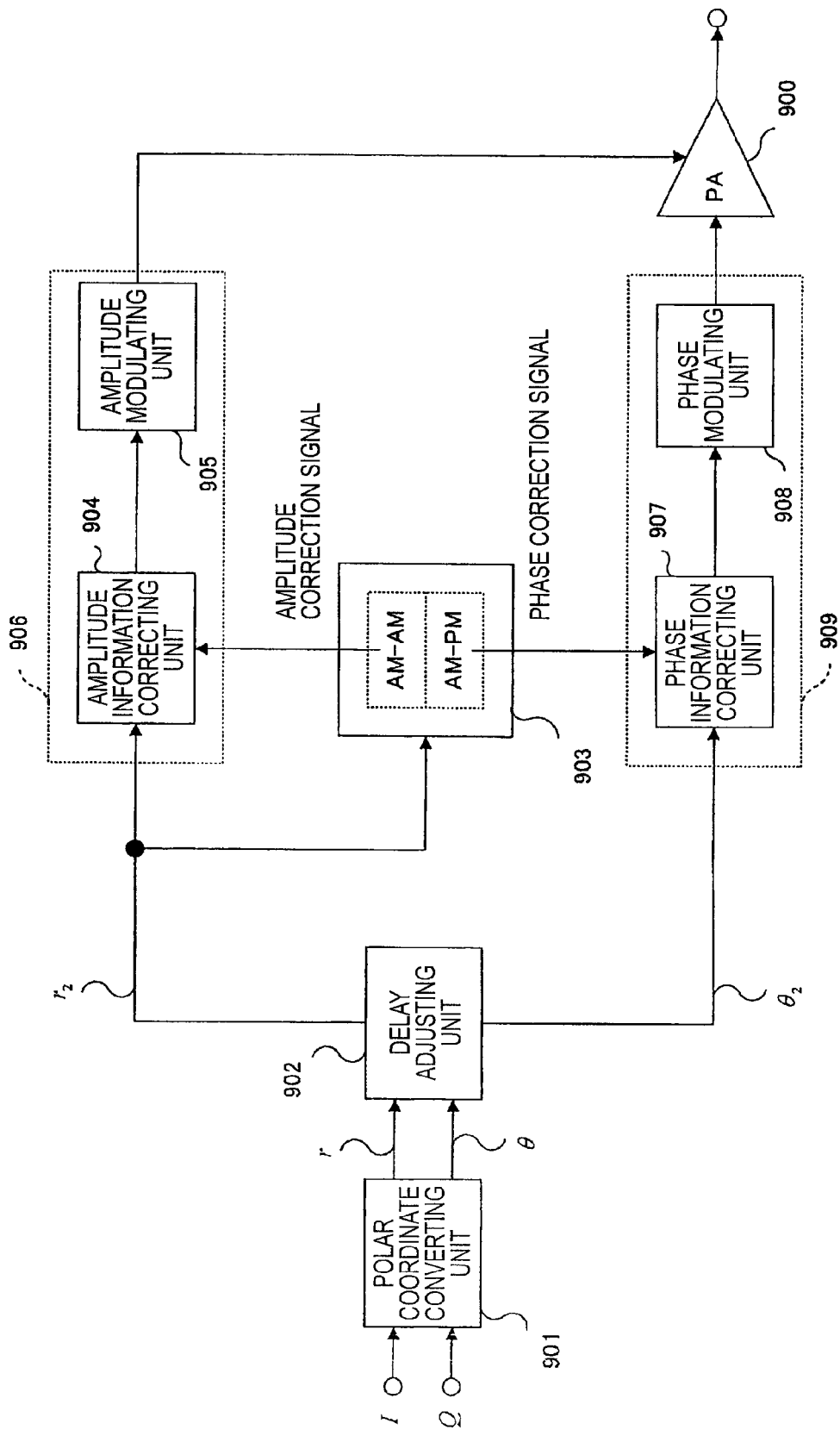
FIG. 12 is a block diagram of an arrangement of the transmission device according to a prior art.
Figure 13:
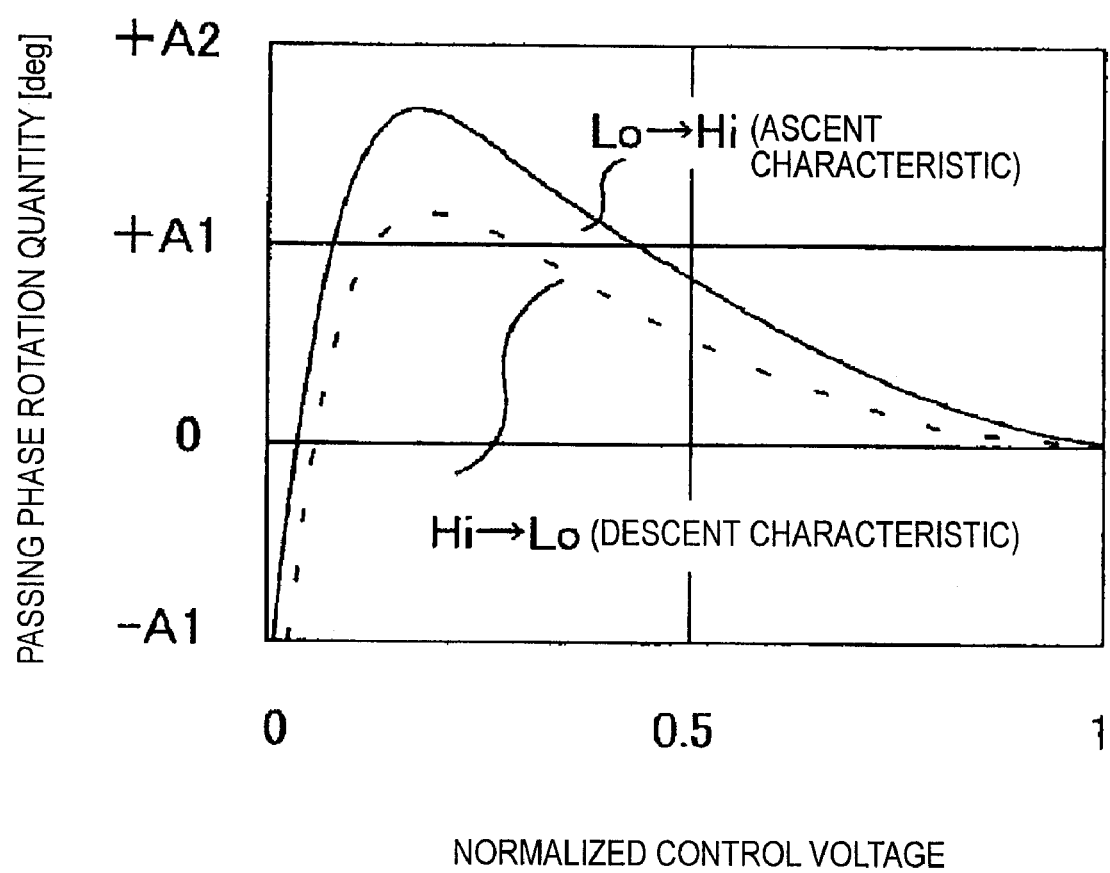
FIG. 13 is a graph showing a change in the AM-PM characteristic in the power amplifying unit according to a prior art.
Figure 14:
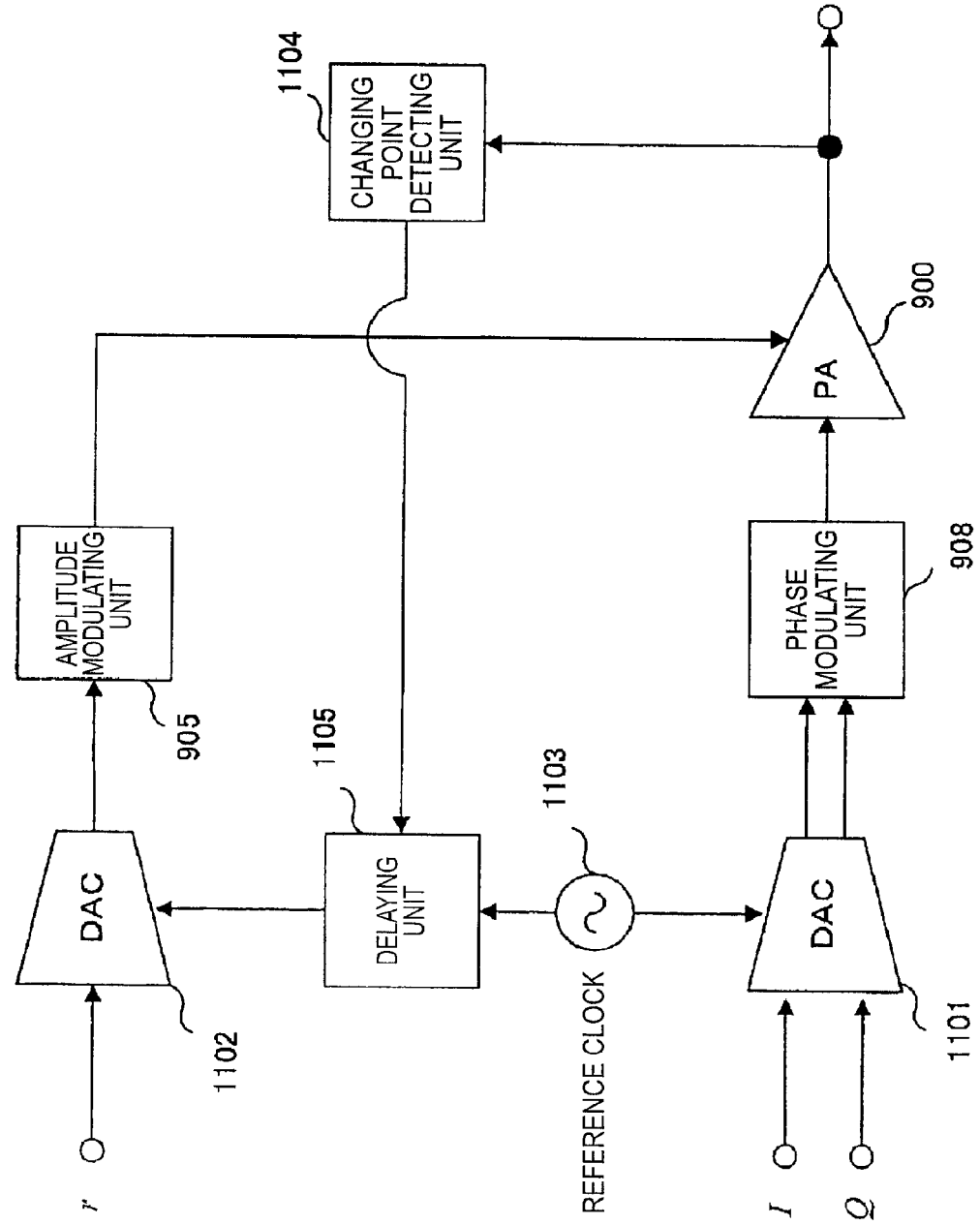
FIG. 14 is a block diagram of an arrangement of the transmission device according to a prior art.

Next, a detailed explanation will be given of the operation of the phase adjustment quantity determining unit 601 and phase adjusting unit 602. Prior to explanation of the operation, it will be explained that correction of the synchronization divergence is equivalent to phase adjustment. FIG. 10 shows the AM-PM characteristic for compensation. In FIG. 10, the abscissa represents a control voltage (x) and the ordinate represents a passing phase rotation quantity (y).

The AM-PM characteristic A701 indicated by solid line in FIG. 10 is a graph of the phase relationship between the input signal and output signal of the power amplifying unit 105 for each of the control voltages, which was measured by e.g. a network analyzer. The AM-PM characteristic A701 corresponds to the AM-PM characteristic shown in FIG. 2. The AM-PM characteristic B702 indicated by dotted line represents the phase relationship between the input signal and output signal of the power amplifying unit 105, which is expected by an actual polar modulating circuit.

Since the relative relationship between the input signal and the output signal is acquired in the above measurement, for example, of influences of the base-collector depletion layer capacitor 405 in FIG. 4, the influence acting on the relationship between the input signal and output signal appears in the measured data. Specifically, in the range of a low control voltage, the base-collector depletion layer capacitor 405 increases. Thus, at the output terminal of the power amplifying unit 105, in addition the component amplified by the power amplifying unit 105, the component which leaks from the input to the output through the increasing base-collector depletion layer capacitor 405 increases. As a result, the passing phase characteristic changes.

On the other hand, as explained in connection with the first embodiment of this invention, of influences of the base-collector depletion layer capacitor 405, the influence acting on the relationship between the amplitude signal and the phase signal, i.e. the influence acting on the relationship between the input signal and output signal when are expressed by the power amplifying unit 105, does not appear in the measured data. Therefore, where the AM-PM characteristic A701 is employed as it is, in order to exclude the influence of the base-collector depletion layer capacitor 405, the technique for synchronization adjustment as proposed in the first embodiment of this invention is indispensable.

In the fifth embodiment of this invention, the synchronization adjustment was replaced by the phase adjustment. Namely, in this embodiment, it was noted that in a range of reducing the control voltage, under the influence of the base-collector depletion layer capacitor 405, the phase signal lags behind the amplitude signal.

Concretely, in contrast to the AM-PM characteristic A701 indicated by solid line in FIG. 10, the AM-PM characteristic B702 indicated by dotted line in the same figure is used as compensation data. Specifically, assuming that the AM-PM characteristic A701 can be expressed by a function of Equation (2), in a region of a lower control voltage, the base-collector depletion layer capacitor 405 increases so that the phase signal lags behind the amplitude signal. Considering this fact, the function of Equation (3) expressing the AM-PM characteristic B702 is provided as a phase adjustment quantity. Now, the term RF_freq in Equation (3) denotes the frequency of the input signal to the high frequency signal input terminal of the power amplifying unit 105, and considers the synchronization divergence between the amplitude signal and the phase signal occurring owing to the change in the base-collector depletion layer capacitor 405 and a frequency difference between the amplitude signal and the phase signal.

[Equation 2]

$$y = f_1(x) \quad (2)$$

[Equation 3]

$$y = f_1(x) \times f_2(x, RF\_freq) \quad (3)$$

FIG. 9 shows the arrangement for substituting the phase adjustment for the synchronization adjustment. Specifically, on the basis of the amplitude signal r(t), transmission level information S1 and known AM-AM characteristic, the phase adjustment quantity represented by $f_2(x, RF\_freq)$ in Equation (3) for the amplitude signal is previously acquired. The phase adjustment quantity is stored as the table data for the amplitude signal in the phase adjustment quantity determining unit 601. Using the amplitude signal r(t) as the reference signal, the phase adjustment quantity information is supplied to the phase adjusting unit 602.

On the basis of the phase adjustment quantity information transmitted from the phase adjustment quantity determining unit 601, in the phase adjusting unit 602, the phase correction signal Tcomp(t) produced from the memory 101 is multiplied by the phase adjustment quantity ($f_2(x, RF\_freq)$) thereby to generate Tcomp2(t) which is supplied to the phase information correcting unit 110.

As described above, in accordance with the fifth embodiment of this invention, by making it possible to handle the synchronization adjustment and the phase adjustment equivalently, the delay adjusting unit having a large circuit scale can be replaced by the phase adjusting unit which is constructed of the multiplying circuit having a small circuit scale. In addition, the synchronization divergence in composing the phase-modulated signal and the amplitude-modulated signal can be coped with at the point other than the signal changing point, which could not solved by the prior art, without using the system for feeding back the output from the power amplifying unit 105.

Additionally, since the phase adjustment quantity is changed according the baseband frequency, the table data of the delay quantity corresponding to the baseband signal bandwidth is prepared to adjust the delay quantity on the basis of the system information equivalent to the baseband bandwidth transmitted from the control unit (not shown) of the transmission device. In this way, the synchronization can be assured more precisely.

Further, the multiplying processing in the phase adjusting unit 602 may be previously carried out for the AM-PM data stored in the memory 101. In this case also, the same effect can be obtained and the circuit scale can be further reduced.

Further, by combining the first embodiment of this invention and the fifth embodiment of this invention, the synchronization can be assured more precisely.

Incidentally, in the polar modulating circuit according to the embodiments described above, the amplitude correction signal according to the amplitude value of the amplitude signal and the phase correction signal are produced from the memory 101 to make the distortion compensation in the power amplifying unit 105. However, the memory 101, amplitude information correcting unit 107, phase information correcting unit 110 and delay adjusting unit 104 may be removed to provide the polar modulating circuit which aims at only assuring the synchronization.

Incidentally, the polar modulating circuit according to the embodiments described above can be constructed as an integrated circuit in such a manner that it is formed on a silicon substrate.

Further, the polar modulating circuit according to the embodiments described above can be also constructed as a transmission device in such a manner that the I/Q signals from the signal generator for generating any I/Q signals are supplied to the polar coordinate converting unit and the output from the power amplifying unit 105 is connected to the antenna.

This invention has been explained in detail and referring to the specific embodiment. However, it is apparent to those skilled in the art that this invention can be changed or modified in various manners without departing from the spirit and scope of the invention.

This application is based on Japanese Patent Application (Patent Application No. 2005-131998) filed on Apr. 28, 2005, and Patent Application (Patent Application No. 2006-116185) filed on Apr. 19, 2006, and the contents thereof are incorporated herein by reference.

INDUSTRIAL APPLICABILITY

The polar modulating circuit according to this invention has an effect of being capable of compensating for a delay difference between the paths of a phase signal and an amplitude signal while suppressing an increase in the circuit scale in a polar modulating system, and useful in a synchronization adjusting method and a radio transmission device.

The invention claimed is:

1. A polar modulating circuit comprising:
   a polar coordinate converting unit for generating an amplitude signal on the basis of baseband orthogonal signals generated from transmitted data;
   an amplitude modulating unit for generating an amplitude-modulated signal on the basis of the amplitude signal;
   a phase modulating unit for generating a phase-modulated signal in a radio frequency band on the basis of a signal having at least a phase component of the baseband orthogonal signals;
   an amplifying unit for generating transmitted data in the radio frequency band by receiving the phase-modulated signal as an input high frequency signal and amplitude-modulated signal as a control signal;
   a delay quantity determining unit for storing delay quantity information for correcting a delay difference between paths of the amplitude signal and the phase signal according to an amplitude value of the amplitude signal or transmission level information indicative of a radio transmission level of the transmitted data; and
   a delay adjusting unit for giving a delay to the amplitude signal or the signal having at least the phase component on the basis of the delay quantity information.

2. The polar modulating circuit according to claim 1 further comprising a memory unit for storing pre-distortion distortion correction data for predetermined amplitude correction and producing, on the basis of the amplitude signal, an amplitude correction signal and a phase correction signal for the amplitude signal or the signal having at least the phase component, respectively.

3. The polar modulating circuit according to claim 1, wherein the delay quantity information is a value determined on the basis of a step response characteristic of an output from the amplifying unit for the control signal supplied to the amplifying unit.

4. The polar modulating circuit according to claim 1, wherein the delay quantity determining unit has a data table for storing the delay quantity information relative to the amplitude value of the amplitude signal or the transmission level information.

5. The polar modulating circuit according to claim 1, wherein the phase modulating unit includes
   an orthogonal coordinate converting unit for generating orthogonal signals having prescribed amplitude values on the basis of the phase information supplied from the delay adjusting unit and
   an orthogonal modulating unit for generating the phase-modulated signal in the radio frequency band on the basis of the orthogonal signals and supplying it to the amplifying unit.

6. The polar modulating circuit according to claim 1, wherein the delay adjusting unit includes
   a first delay adjusting unit for executing delay adjustment in units of a predetermined operating clock for a digital signal processing unit constituting the polar modulating circuit; and
   a second delay adjusting unit for executing delay adjustment shorter than the units of the clock.

7. The polar modulating circuit according to claim 6, wherein the second delay adjusting unit executes linear interpolation based on a plurality of signal amplitude values after delay-adjusted in units of the predetermined operating clock and the delay quantity information.

8. A polar modulating circuit comprising:
   a polar coordinate converting unit for generating an amplitude signal on the basis of baseband orthogonal signals generated from transmitted data;
   an amplitude modulating unit for generating an amplitude-modulated signal on the basis of the amplitude signal;
   a phase modulating unit for generating a phase-modulated signal in a radio frequency band on the basis of a signal having at least a phase component of the baseband orthogonal signals;
   an amplifying unit for generating transmitted data in the radio frequency band by receiving the phase-modulated signal as an input high frequency signal and amplitude-modulated signal as a control signal;
   a delay quantity determining unit for storing phase adjustment quantity information for correcting a phase difference between the amplitude signal and the phase signal according to an amplitude value of the amplitude signal or transmission level information indicative of a radio transmission level of the transmitted data; and
   a phase adjusting unit for adjusting the phase of the amplitude signal or the signal having at least the phase component on the basis of the phase adjustment quantity information.

9. The polar modulating circuit according to claim 8, further comprising a memory unit for storing pre-distortion distortion correction data for predetermined amplitude correction and producing, on the basis of the amplitude signal, an amplitude correction signal and a phase correction signal for the amplitude signal or the signal having at least the phase component, respectively.

10. The polar modulating circuit according to claim 9, wherein the phase adjusting unit is constructed of a multiplying circuit for multiplying the phase adjustment quantity information and the phase correction signal.

11. The polar modulating circuit according to claim 9, wherein the phase adjustment quantity determining unit has a data table for storing the phase adjustment quantity information relative to the amplitude value of the amplitude signal or the transmission level information.

12. A polar modulating method comprising:
- a polar coordinate converting step for generating an amplitude signal on the basis of baseband orthogonal signals generated from transmitted data;
- an amplitude modulating step for generating an amplitude-modulated signal on the basis of the amplitude signal;
- a phase modulating step for generating a phase-modulated signal in a radio frequency band on the basis of a signal having at least a phase component of the baseband orthogonal signals;
- an amplifying step for generating transmitted data in the radio frequency band by receiving the phase-modulated signal as an input high frequency signal and amplitude-modulated signal as a control signal;
- a delay quantity determining step for storing delay quantity information for correcting a delay difference between paths of the amplitude signal and the phase signal according to an amplitude value of the amplitude signal or transmission level information indicative of a radio transmission level of the transmitted data; and
- a delay adjusting step for giving a delay to the amplitude signal or the signal having at least the phase component on the basis of the delay quantity information.

13. An integrated circuit in which the polar modulating circuit according to claim 1 is mounted.

14. A radio transmission device comprising the polar modulating circuit according to claim 1.

15. An integrated circuit in which the polar modulating circuit according to claim 8 is mounted.

16. A radio transmission device comprising the polar modulating circuit according to claim 8.

17. A radio transmission device comprising the integrated circuit according to claim 13.

* * * * *